United States Patent
Wagh et al.

(10) Patent No.: US 9,692,402 B2
(45) Date of Patent: Jun. 27, 2017

(54) METHOD, APPARATUS, SYSTEM FOR CENTERING IN A HIGH PERFORMANCE INTERCONNECT

(71) Applicant: Intel Corporation, Santa Clara, CA (US)

(72) Inventors: Mahesh Wagh, Portland, OR (US);
Zuoguo Wu, San Jose, CA (US);
Venkatraman Iyer, Austin, TX (US);
Gerald S. Pasdast, San Jose, CA (US);
Todd A. Hinck, Arlington, MA (US);
David M. Lee, Portland, OR (US);
Narasimha R. Lanka, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 120 days.

(21) Appl. No.: 14/583,139

(22) Filed: Dec. 25, 2014

(65) Prior Publication Data
US 2016/0191034 A1    Jun. 30, 2016

(51) Int. Cl.
*G06F 1/04*    (2006.01)
*H03K 5/26*    (2006.01)
(Continued)

(52) U.S. Cl.
CPC ............ *H03K 5/26* (2013.01); *G01R 31/041* (2013.01); *H03L 9/00* (2013.01)

(58) Field of Classification Search
CPC .... G06F 12/0831; G06F 13/4286; G06F 8/71; G06F 8/77
(Continued)

(56) References Cited

U.S. PATENT DOCUMENTS 8,837,655 B2    9/2014 Pyeon
2002/0133762 A1*    9/2002 Susnow ............... G06F 11/076
714/704

(Continued)

FOREIGN PATENT DOCUMENTS

WO    2016105862    6/2016

OTHER PUBLICATIONS

International Search Report and Written Opinion in International Application No. PCT/US2015/062855 mailed on Mar. 31, 2016; 11 pages.

*Primary Examiner* — Vincent Tran
(74) *Attorney, Agent, or Firm* — Patent Capital Group

(57) ABSTRACT

In an example, a system and method for centering in a high-performance interconnect (HPI) are disclosed. When an interconnect is powered up from a dormant state, it may be necessary to "center" the clock signal to ensure that data are read at the correct time. A multi-phase method may be used, in which a first phase comprises a reference voltage sweep to identify an optimal reference voltage. A second phase comprises a phase sweep to identify an optimal phase. A third sweep comprises a two-dimensional "eye" phase, in which a plurality of values within a two-dimensional eye derived from the first two sweeps are tested. In each case, the optimal value is the value that results in the fewest bit error across multiple lanes. In one example, the second and third phases are performed in software, and may include testing a "victim" lane, with adjacent "aggressor" lanes having a complementary bit pattern.

23 Claims, 13 Drawing Sheets

(51) Int. Cl.
*G01R 31/04* (2006.01)
*H03L 9/00* (2006.01)

(58) Field of Classification Search
USPC .......................................................... 713/503
See application file for complete search history.

(56) References Cited

U.S. PATENT DOCUMENTS

| | | | |
|---|---|---|---|
| 2004/0181714 A1* | 9/2004 | Jungerman | H04L 1/20 714/704 |
| 2005/0259774 A1 | 11/2005 | Garlepp | |
| 2008/0082880 A1* | 4/2008 | Wang | G01R 31/31937 714/731 |
| 2008/0209306 A1* | 8/2008 | Frodsham | H04L 1/242 714/801 |
| 2009/0016476 A1 | 1/2009 | Kim et al. | |
| 2009/0168860 A1* | 7/2009 | Magagni | H04L 7/10 375/226 |
| 2009/0175325 A1* | 7/2009 | Sorna | H04L 1/205 375/226 |
| 2010/0042874 A1* | 2/2010 | Lee | G06F 11/2221 714/27 |
| 2010/0329403 A1* | 12/2010 | Beukema | H03K 5/15013 375/356 |
| 2011/0066926 A1* | 3/2011 | Schumacher | G06F 11/1004 714/807 |
| 2011/0110439 A1* | 5/2011 | Miyaoka | H04B 1/0475 375/259 |
| 2013/0148709 A1* | 6/2013 | Frans | H04L 1/0002 375/224 |
| 2013/0230122 A1 | 9/2013 | Ware et al. | |
| 2014/0070862 A1 | 3/2014 | Palmer et al. | |
| 2014/0157067 A1* | 6/2014 | Yang | G06F 11/1048 714/720 |

\* cited by examiner

METHOD, APPARATUS, SYSTEM FOR CENTERING IN A HIGH PERFORMANCE INTERCONNECT

FIELD

This disclosure pertains to computing system, and in particular (but not exclusively) to high-performance interconnects.

BACKGROUND

A high-performance interconnect (HPI) is a next-generation interconnect that couples agents, such as processing cores, to one another, or to memory. Thus HPI is an extremely fast protocol, operating on the order of 8 Gbps at full speed. However, this extremely fast data rate makes HPI less fault tolerant than slower protocols. Thus, over time, with voltage and temperature variations, clock signals may "drift" from center, resulting in bit errors.

DETAILED DESCRIPTION

Figure 1:
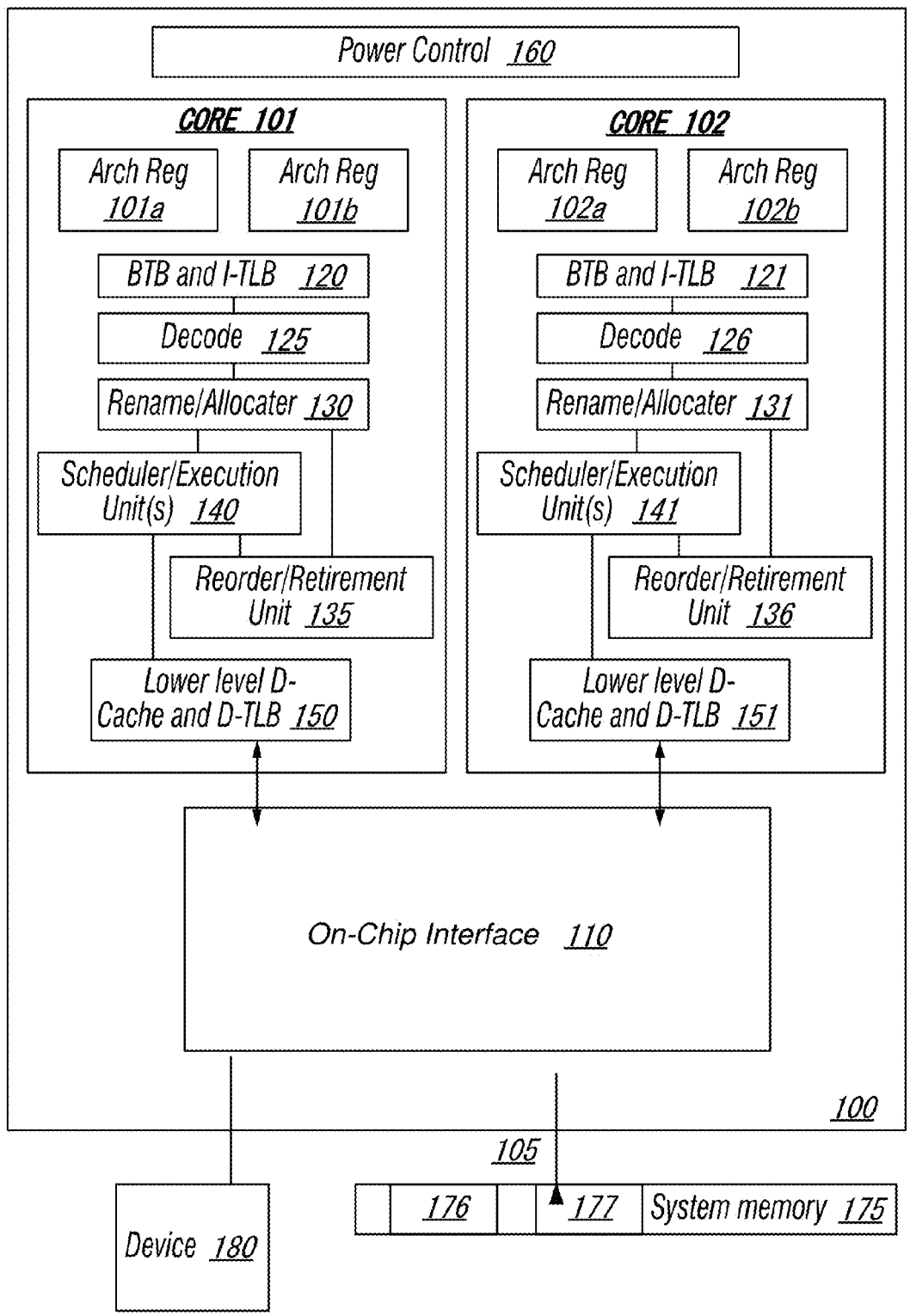
FIG. 1 illustrates an embodiment of a block diagram for a computing system including a multicore processor.

In the following description, numerous specific details are set forth, such as examples of specific types of processors and system configurations, specific hardware structures, specific architectural and micro architectural details, specific register configurations, specific instruction types, specific system components, specific measurements/heights, specific processor pipeline stages and operation etc. in order to provide a thorough understanding of the present invention. It will be apparent, however, to one skilled in the art that these specific details need not be employed to practice the present invention. In other instances, well known components or methods, such as specific and alternative processor architectures, specific logic circuits/code for described algorithms, specific firmware code, specific interconnect operation, specific logic configurations, specific manufacturing techniques and materials, specific compiler implementations, specific expression of algorithms in code, specific power down and gating techniques/logic and other specific operational details of computer system haven't been described in detail in order to avoid unnecessarily obscuring the present invention.

Although the following embodiments may be described with reference to energy conservation and energy efficiency in specific integrated circuits, such as in computing platforms or microprocessors, other embodiments are applicable to other types of integrated circuits and logic devices. Similar techniques and teachings of embodiments described herein may be applied to other types of circuits or semiconductor devices that may also benefit from better energy efficiency and energy conservation. For example, the disclosed embodiments are not limited to desktop computer systems or Ultrabooks™. And may be also used in other devices, such as handheld devices, tablets, other thin notebooks, systems on a chip (SOC) devices, and embedded applications. Some examples of handheld devices include cellular phones, Internet protocol devices, digital cameras, personal digital assistants (PDAs), and handheld PCs. Embedded applications typically include a microcontroller, a digital signal processor (DSP), a system on a chip, network computers (NetPC), set-top boxes, network hubs, wide area network (WAN) switches, or any other system that can perform the functions and operations taught below. Moreover, the apparatus', methods, and systems described herein are not limited to physical computing devices, but may also relate to software optimizations for energy conservation and efficiency. As will become readily apparent in the description below, the embodiments of methods, apparatus', and systems described herein (whether in reference to hardware, firmware, software, or a combination thereof) are vital to a 'green technology' future balanced with performance considerations.

As computing systems are advancing, the components therein are becoming more complex. As a result, the interconnect architecture to couple and communicate between the components is also increasing in complexity to ensure bandwidth requirements are met for optimal component operation. Furthermore, different market segments demand different aspects of interconnect architectures to suit the market's needs. For example, servers require higher performance, while the mobile ecosystem is sometimes able to sacrifice overall performance for power savings. Yet, it's a singular purpose of most fabrics to provide highest possible performance with maximum power saving. Below, a number of interconnects are discussed, which would potentially benefit from aspects of the invention described herein.

FIG. 1

Referring to FIG. 1, an embodiment of a block diagram for a computing system including a multicore processor is depicted. Processor 100 includes any processor or processing device, such as a microprocessor, an embedded processor, a digital signal processor (DSP), a network processor, a handheld processor, an application processor, a co-processor, a system on a chip (SOC), or other device to execute code. Processor 100, in one embodiment, includes at least two cores—core 101 and 102, which may include asymmetric cores or symmetric cores (the illustrated embodiment). However, processor 100 may include any number of processing elements that may be symmetric or asymmetric.

In one embodiment, a processing element refers to hardware or logic to support a software thread. Examples of hardware processing elements include: a thread unit, a thread slot, a thread, a process unit, a context, a context unit, a logical processor, a hardware thread, a core, and/or any other element, which is capable of holding a state for a processor, such as an execution state or architectural state. In other words, a processing element, in one embodiment, refers to any hardware capable of being independently associated with code, such as a software thread, operating system, application, or other code. A physical processor (or processor socket) typically refers to an integrated circuit, which potentially includes any number of other processing elements, such as cores or hardware threads.

A core often refers to logic located on an integrated circuit capable of maintaining an independent architectural state, wherein each independently maintained architectural state is associated with at least some dedicated execution resources. In contrast to cores, a hardware thread typically refers to any logic located on an integrated circuit capable of maintaining an independent architectural state, wherein the independently maintained architectural states share access to execution resources. As can be seen, when certain resources are shared and others are dedicated to an architectural state, the line between the nomenclature of a hardware thread and core overlaps. Yet often, a core and a hardware thread are viewed by an operating system as individual logical processors, where the operating system is able to individually schedule operations on each logical processor.

Physical processor 100, as illustrated in FIG. 1, includes two cores—core 101 and 102. Here, core 101 and 102 are considered symmetric cores, i.e. cores with the same configurations, functional units, and/or logic. In another embodiment, core 101 includes an out-of-order processor core, while core 102 includes an in-order processor core. However, cores 101 and 102 may be individually selected from any type of core, such as a native core, a software managed core, a core adapted to execute a native Instruction Set Architecture (ISA), a core adapted to execute a translated Instruction Set Architecture (ISA), a co-designed core, or other known core. In a heterogeneous core environment (i.e. asymmetric cores), some form of translation, such a binary translation, may be utilized to schedule or execute code on one or both cores. Yet to further the discussion, the functional units illustrated in core 101 are described in further detail below, as the units in core 102 operate in a similar manner in the depicted embodiment.

As depicted, core 101 includes two hardware threads 101a and 101b, which may also be referred to as hardware thread slots 101a and 101b. Therefore, software entities, such as an operating system, in one embodiment potentially view processor 100 as four separate processors, i.e., four logical processors or processing elements capable of executing four software threads concurrently. As alluded to above, a first thread is associated with architecture state registers 101a, a second thread is associated with architecture state registers 101b, a third thread may be associated with architecture state registers 102a, and a fourth thread may be associated with architecture state registers 102b. Here, each of the architecture state registers (101a, 101b, 102a, and 102b) may be referred to as processing elements, thread slots, or thread units, as described above. As illustrated, architecture state registers 101a are replicated in architecture state registers 101b, so individual architecture states/contexts are capable of being stored for logical processor 101a and logical processor 101b. In core 101, other smaller resources, such as instruction pointers and renaming logic in allocator and renamer block 130 may also be replicated for threads 101a and 101b. Some resources, such as re-order buffers in reorder/retirement unit 135, ILTB 120, load/store buffers, and queues may be shared through partitioning. Other resources, such as general purpose internal registers, page-table base register(s), low-level data-cache and data-TLB 115, execution unit(s) 140, and portions of out-of-order unit 135 are potentially fully shared.

Processor 100 often includes other resources, which may be fully shared, shared through partitioning, or dedicated by/to processing elements. In FIG. 1, an embodiment of a purely exemplary processor with illustrative logical units/resources of a processor is illustrated. Note that a processor may include, or omit, any of these functional units, as well as include any other known functional units, logic, or firmware not depicted. As illustrated, core 101 includes a simplified, representative out-of-order (OOO) processor core. But an in-order processor may be utilized in different embodiments. The OOO core includes a branch target buffer 120 to predict branches to be executed/taken and an instruction-translation buffer (I-TLB) 120 to store address translation entries for instructions.

Core 101 further includes decode module 125 coupled to fetch unit 120 to decode fetched elements. Fetch logic, in one embodiment, includes individual sequencers associated with thread slots 101a, 101b, respectively. Usually core 101 is associated with a first ISA, which defines/specifies instructions executable on processor 100. Often machine code instructions that are part of the first ISA include a portion of the instruction (referred to as an opcode), which references/specifies an instruction or operation to be performed. Decode logic 125 includes circuitry that recognizes these instructions from their opcodes and passes the decoded instructions on in the pipeline for processing as defined by the first ISA. For example, as discussed in more detail below decoders 125, in one embodiment, include logic designed or adapted to recognize specific instructions, such as transactional instruction. As a result of the recognition by decoders 125, the architecture or core 101 takes specific, predefined actions to perform tasks associated with the appropriate instruction. It is important to note that any of the tasks, blocks, operations, and methods described herein may be performed in response to a single or multiple instructions; some of which may be new or old instructions. Note decoders 126, in one embodiment, recognize the same ISA (or a subset thereof). Alternatively, in a heterogeneous core environment, decoders 126 recognize a second ISA (either a subset of the first ISA or a distinct ISA).

In one example, allocator and renamer block 130 includes an allocator to reserve resources, such as register files to store instruction processing results. However, threads 101a and 101b are potentially capable of out-of-order execution, where allocator and renamer block 130 also reserves other resources, such as reorder buffers to track instruction results. Unit 130 may also include a register renamer to rename program/instruction reference registers to other registers internal to processor 100. Reorder/retirement unit 135 includes components, such as the reorder buffers mentioned above, load buffers, and store buffers, to support out-of-order execution and later in-order retirement of instructions executed out-of-order.

Scheduler and execution unit(s) block 140, in one embodiment, includes a scheduler unit to schedule instructions/operation on execution units. For example, a floating point instruction is scheduled on a port of an execution unit that has an available floating point execution unit. Register files associated with the execution units are also included to store information instruction processing results. Exemplary execution units include a floating point execution unit, an integer execution unit, a jump execution unit, a load execution unit, a store execution unit, and other known execution units.

Lower level data cache and data translation buffer (D-TLB) 150 are coupled to execution unit(s) 140. The data cache is to store recently used/operated on elements, such as data operands, which are potentially held in memory coherency states. The D-TLB is to store recent virtual/linear to physical address translations. As a specific example, a processor may include a page table structure to break physical memory into a plurality of virtual pages.

Here, cores 101 and 102 share access to higher-level or further-out cache, such as a second level cache associated with on-chip interface 110. Note that higher-level or further-out refers to cache levels increasing or getting further way from the execution unit(s). In one embodiment, higher-level cache is a last-level data cache—last cache in the memory hierarchy on processor 100—such as a second or third level data cache. However, higher level cache is not so limited, as it may be associated with or include an instruction cache. A trace cache—a type of instruction cache—instead may be coupled after decoder 125 to store recently decoded traces. Here, an instruction potentially refers to a macro-instruction (i.e. a general instruction recognized by the decoders), which may decode into a number of micro-instructions (micro-operations).

In the depicted configuration, processor 100 also includes on-chip interface module 110. Historically, a memory controller, which is described in more detail below, has been included in a computing system external to processor 100. In this scenario, on-chip interface 11 is to communicate with devices external to processor 100, such as system memory 175, a chipset (often including a memory controller hub to connect to memory 175 and an I/O controller hub to connect peripheral devices), a memory controller hub, a northbridge, or other integrated circuit. And in this scenario, bus 105 may include any known interconnect, such as multi-drop bus, a point-to-point interconnect, a serial interconnect, a parallel bus, a coherent (e.g. cache coherent) bus, a layered protocol architecture, a differential bus, and a GTL bus.

Memory 175 may be dedicated to processor 100 or shared with other devices in a system. Common examples of types of memory 175 include DRAM, SRAM, non-volatile memory (NV memory), and other known storage devices. Note that device 180 may include a graphic accelerator, processor or card coupled to a memory controller hub, data storage coupled to an I/O controller hub, a wireless transceiver, a flash device, an audio controller, a network controller, or other known device.

Recently however, as more logic and devices are being integrated on a single die, such as SOC, each of these devices may be incorporated on processor 100. For example in one embodiment, a memory controller hub is on the same package and/or die with processor 100. Here, a portion of the core (an on-core portion) 110 includes one or more controller(s) for interfacing with other devices such as memory 175 or a graphics device 180. The configuration including an interconnect and controllers for interfacing with such devices is often referred to as an on-core (or un-core configuration). As an example, on-chip interface 110 includes a ring interconnect for on-chip communication and a high-speed serial point-to-point link 105 for off-chip communication. Yet, in the SOC environment, even more devices, such as the network interface, co-processors, memory 175, graphics processor 180, and any other known computer devices/interface may be integrated on a single die or integrated circuit to provide small form factor with high functionality and low power consumption.

In one embodiment, processor 100 is capable of executing a compiler, optimization, and/or translator code 177 to compile, translate, and/or optimize application code 176 to support the apparatus and methods described herein or to interface therewith. A compiler often includes a program or set of programs to translate source text/code into target text/code. Usually, compilation of program/application code with a compiler is done in multiple phases and passes to transform hi-level programming language code into low-level machine or assembly language code. Yet, single pass compilers may still be utilized for simple compilation. A compiler may utilize any known compilation techniques and perform any known compiler operations, such as lexical analysis, preprocessing, parsing, semantic analysis, code generation, code transformation, and code optimization.

Larger compilers often include multiple phases, but most often these phases are included within two general phases: (1) a front-end, i.e. generally where syntactic processing, semantic processing, and some transformation/optimization may take place, and (2) a back-end, i.e. generally where analysis, transformations, optimizations, and code generation takes place. Some compilers refer to a middle, which illustrates the blurring of delineation between a front-end and back end of a compiler. As a result, reference to insertion, association, generation, or other operation of a compiler may take place in any of the aforementioned phases or passes, as well as any other known phases or passes of a compiler. As an illustrative example, a compiler potentially inserts operations, calls, functions, etc. in one or more phases of compilation, such as insertion of calls/operations in a front-end phase of compilation and then transformation of the calls/operations into lower-level code during a transformation phase. Note that during dynamic compilation, compiler code or dynamic optimization code may insert such operations/calls, as well as optimize the code for execution during runtime. As a specific illustrative example, binary code (already compiled code) may be dynamically optimized during runtime. Here, the program code may include the dynamic optimization code, the binary code, or a combination thereof.

Similar to a compiler, a translator, such as a binary translator, translates code either statically or dynamically to optimize and/or translate code. Therefore, reference to execution of code, application code, program code, or other software environment may refer to: (1) execution of a compiler program(s), optimization code optimizer, or translator either dynamically or statically, to compile program code, to maintain software structures, to perform other operations, to optimize code, or to translate code; (2) execution of main program code including operations/calls, such as application code that has been optimized/compiled; (3) execution of other program code, such as libraries, associated with the main program code to maintain software structures, to perform other software related operations, or to optimize code; or (4) a combination thereof.

Figure 3:
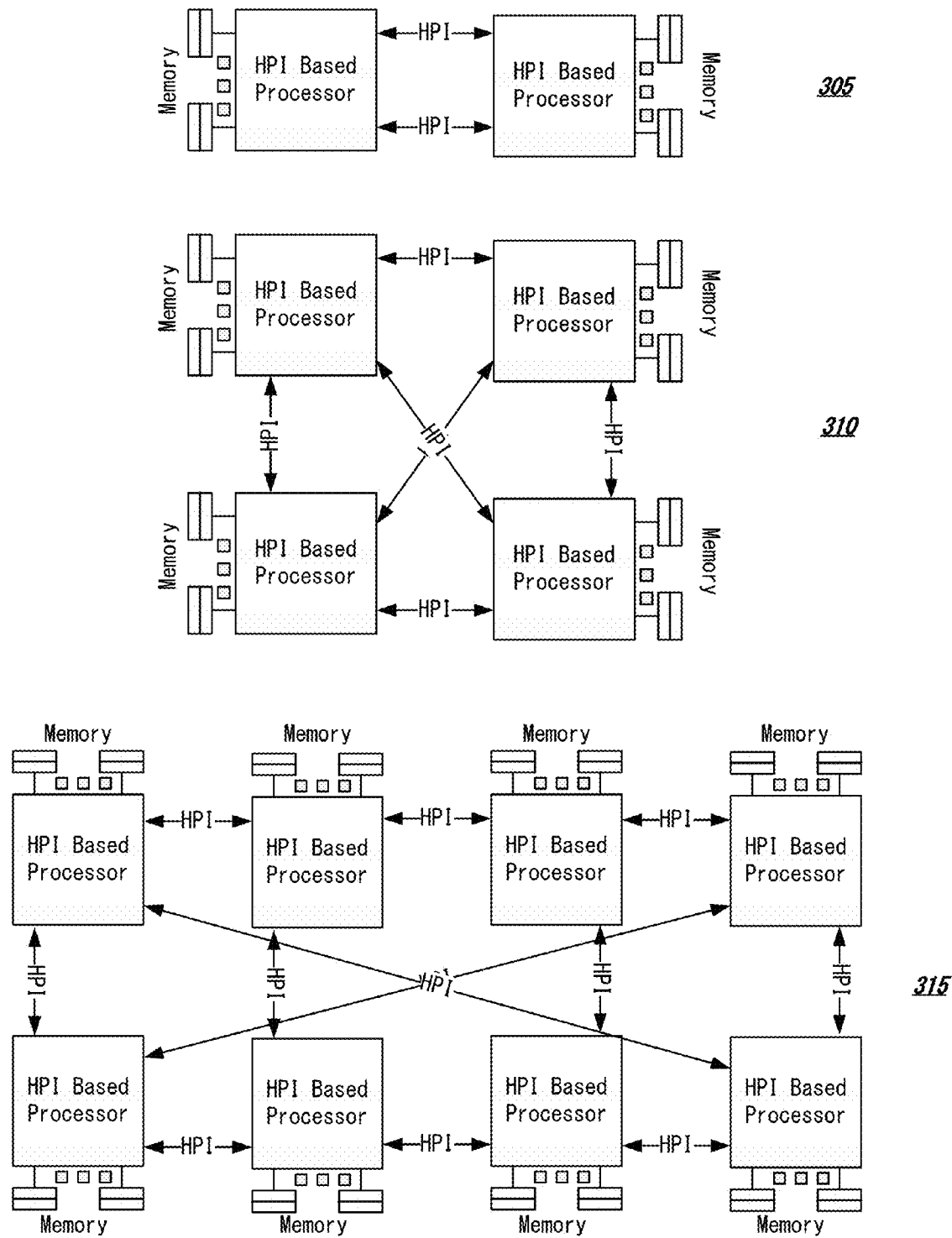
FIG. 3 illustrates embodiments of multi-processor configurations utilizing a high performance interconnect architecture.

In one embodiment, a new High Performance Interconnect (HPI) is provided. HPI is a next-generation cache-coherent, link-based interconnect. As one example, HPI may be utilized in high performance computing platforms, such as workstations or servers, where PCIe is typically used to connect accelerators or I/O devices. However, HPI is not so limited. Instead, HPI may be utilized in any of the systems or platforms described herein. Furthermore, the individual ideas developed may be applied to other interconnects, such as PCIe. Moreover, HPI may be extended to compete in the same market as other interconnect, such as PCIe. To support multiple devices, in one implementation, HPI includes an Instruction Set Architecture (ISA) agnostic (i.e. HPI is able to be implemented in multiple different devices). In another scenario, HPI may also be utilized to connect high performance I/O devices, not just processors or accelerators. For example, a high performance PCIe device may be coupled to HPI through an appropriate translation bridge (i.e. HPI to PCIe). Moreover, the HPI links may be utilized many HPI based devices, such as processors, in various ways (e.g. stars, rings, meshes, etc.). FIG. 3 illustrates an embodiment of multiple potential multi-socket configurations. A two-socket configuration 305, as depicted, includes two HPI links; however, in other implementations, one HPI link may be utilized. For larger topologies, any configuration may be utilized as long as an ID is assignable and there is some form of virtual path. As shown 4 socket configuration 310 has an HPI link from each processor to another. But in the 8 socket implementation shown in configuration 315, not every socket is directly connected to each other through an HPI link. However, if a virtual path exists between the processors, the configuration is supported. A range of supported processors includes 2-32 in a native domain. Higher number of processors may be reached through use of multiple domains or other interconnects between node controllers.

The HPI architecture includes a definition of a layered protocol architecture, which is similar to PCIe in that it also includes a layered protocol architecture. In one embodiment, HPI defines protocol layers (coherent, non-coherent, and optionally other memory based protocols), a routing layer, a link layer, and a physical layer. Furthermore, as many other interconnect architecture's HPI includes enhancements related to power managers, design for test and debug (DFT), fault handling, registers, security, etc.

Figure 2:
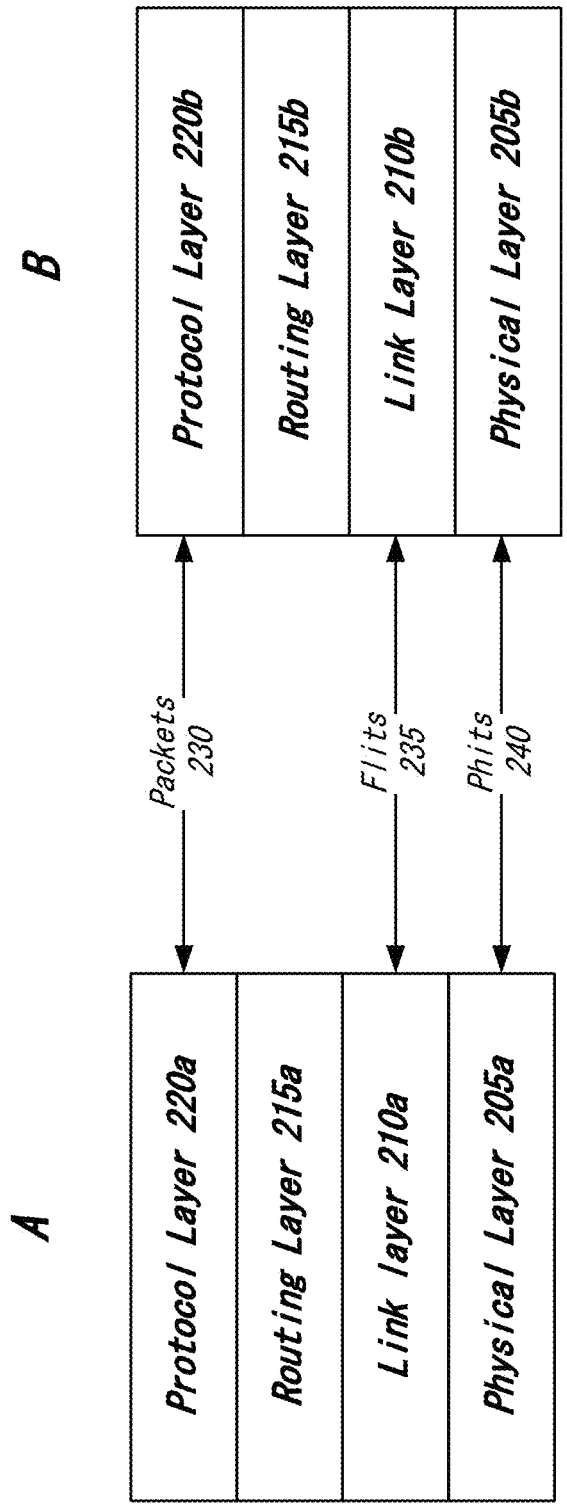
FIG. 2 illustrates an embodiment of a layered stack for a high performance interconnect architecture.

FIG. 2 illustrates an embodiment of potential layers in the HPI layered protocol stack; however, these layers are not required and may be optional in some implementations. Each layer deals with its own level of granularity or quantum of information (the protocol layer 205a,b with packets 230, link layer 210a,b with flits 235, and physical layer 205a,b with phits 240). Note that a packet, in some embodiments, may include partial flits, a single flit, or multiple flits based on the implementation.

As a first example, a width of a phit 240 includes a 1 to 1 mapping of link width to bits (e.g. 20 bit link width includes a phit of 20 bits, etc.). Flits may have a greater size, such as 184, 192, or 200 bits. Note that if phit 240 is 20 bits wide and the size of flit 235 is 184 bits then it takes a fractional number of phits 240 to transmit one flit 235 (e.g. 9.2 phits at 20 bits to transmit an 184 bit flit 235 or 9.6 at 20 bits to transmit a 192 bit flit). Note that widths of the fundamental link at the physical layer may vary. For example, the number of lanes per direction may include 2, 4, 6, 8, 10, 12, 14, 16, 18, 20, 22, 24, etc. In one embodiment, link layer 210a,b is capable of embedding multiple pieces of different transactions in a single flit, and within the flit multiple headers (e.g. 1, 2, 3, 4) may be embedded within the flit. Here, HPI splits the headers into corresponding slots to enable multiple messages in the flit destined for different nodes.

Physical layer 205a,b, in one embodiment, is responsible for the fast transfer of information on the physical medium (electrical or optical etc.). The physical link is point to point between two Link layer entities, such as layer 205a and 205b. The Link layer 210a,b abstracts the Physical layer 205a,b from the upper layers and provides the capability to reliably transfer data (as well as requests) and manage flow control between two directly connected entities. It also is responsible for virtualizing the physical channel into multiple virtual channels and message classes. The Protocol layer 220a,b relies on the Link layer 210a,b to map protocol messages into the appropriate message classes and virtual channels before handing them to the Physical layer 205a,b for transfer across the physical links. Link layer 210a,b may support multiple messages, such as a request, snoop, response, writeback, non-coherent data, etc.

In one embodiment, to provide reliable transmission cyclic redundancy check (CRC) error checking and recovery procedures are provided by the Link layer 210a,b in order to isolate the effects of routine bit errors that occur on the physical interconnect. The Link layer 210a generates the CRC at the transmitter and checks at the receiver Link layer 210b.

In some implementations, link layer 210a,b utilized a credit scheme for flow control. During initialization, a sender is given a set number of credits to send packets or flits to a receiver. Whenever a packet or flit is sent to the receiver, the sender decrements its credit counters by one credit which represents either a packet or a flit, depending on the type of virtual network being used. Whenever a buffer is freed at the receiver, a credit is returned back to the sender for that buffer type. When the sender's credits for a given channel have been exhausted, in one embodiment, it stops sending any flits in that channel. Essentially, credits are returned after the receiver has consumed the information and freed the appropriate buffers.

In one embodiment, routing layer 215a,b provides a flexible and distributed way to route packets from a source to a destination. In some platform types (for example, uniprocessor and dual processor systems), this layer may not be explicit but could be part of the Link layer 210a,b; in such a case, this layer is optional. It relies on the virtual network and message class abstraction provided by the Link Layer 210a,b as part of the function to determine how to route the packets. The routing function, in one implementation, is defined through implementation specific routing tables. Such a definition allows a variety of usage models.

In one embodiment, protocol layer 220a,b implement the communication protocols, ordering rule, and coherency maintenance, I/O, interrupts, and other higher-level communication. Note that protocol layer 220a,b, in one implementation provides messages to negotiate power states for components and the system. As a potential addition, physical layer 205a,b may also independently or in conjunction set power states of the individual links.

Multiple agents may be connect to an HPI architecture, such as a home agent (orders requests to memory), caching (issues requests to coherent memory and responds to snoops), configuration (deals with configuration transactions), interrupt (processes interrupts), legacy (deals with legacy transactions), non-coherent (deals with non-coherent transactions), and others. More specific discussion of the layers for HPI are discussed below.

An overview of a few potential features of HPI includes: not utilizing preallocation at home nodes; no ordering requirements for a number of message classes; packing multiple messages in a single flit (protocol header) (i.e. a packed flit that can hold multiple messages in defined slots); a wide link that may scale from 4, 8, 16, 20, or more lanes; a large error checking scheme that may utilize 8, 16, 32, or as much as 64 bits for error protection; and utilizing an embedded clocking scheme.

HPI Physical Layer

The Physical layer 205a,b (or PHY) of HPI rests above the electrical layer (i.e. electrical conductors connecting two components) and below the link layer 210a,b, as illustrated in FIG. 2. The physical layer resides on each agent and connects the link layers on two agents (A and B) separated from each other. The local and remote electrical layers are connected by physical media (e.g. wires, conductors, optical, etc.). The physical layer 205a,b, in one embodiment, has two major phases, initialization and operation. During initialization, the connection is opaque to the link layer and signaling may involve a combination of timed states and handshake events. During operation, the connection is transparent to the link layer and signaling is at a speed, with all lanes operating together as a single link. During the operation phase, the physical layer transports flits from agent A to agent B and from agent B to agent A. The connection is also referred to as a link and abstracts some physical aspects including media, width and speed from the link layers while exchanging flits and control/status of current configuration (e.g. width) with the link layer. The initialization phase includes minor phases e.g. Polling, Configuration. The operation phase also includes minor phases (e.g. link power management states).

In one embodiment, physical layer 205a,b is also: to meet a reliability/error standard, tolerate a failure of a lane on a link and go to a fraction of nominal width, tolerate single failures in opposite direction of a link, support hot add/remove, enabling/disabling PHY ports, timeout initialization attempts when the number of attempts has exceeded a specified threshold etc.

In one embodiment, HPI utilizes a rotating bit pattern. For example when a flit size is not aligned with a multiple of the lanes in an HPI link, the flit may not be able to be sent in an integer multiple of transmissions over the lanes (e.g. a 192-bit flit is not a clean multiple of an exemplary 20 lane link. So at ×20 flits may be interleaved to avoid wasting bandwidth (i.e. sending a partial flit at some point without utilizing the rest of the lanes). The interleaving, in one embodiment, is determined to optimize latency of key fields and multiplexers in the transmitter (Tx) and receiver (Rx). The determined patterning also potentially provides for clean and quick transitioning to/from a smaller width (e.g ×8) and seamless operation at the new width.

In one embodiment, HPI utilizes an embedded clock, such as a 20 bit embedded clock or other number of bit embedded clock. Other high performance interfaces may use a forwarded clock or other clock for inband reset. By embedding clock in HPI, it potentially reduces pinout. However, using an embedded clock, in some implementations, may result in different apparatus and methods to handle inband reset. As a first, example a blocking link state to hold off link flit transmission and allow PHY usage (described in more detail in the Appendix A) is utilized after initialization. As a second example, electrical ordered sets, such as an electrically idle ordered set (EIOS) may be utilized during initialization.

In one embodiment, HPI is capable of utilizing a first bit width direction without a forwarded clock and a second, smaller bit width link for power management. As an example, HPI includes a partial link width transmitting state, where a partial width is utilized (e.g. a ×20 full width and a ×8 partial width); however, the widths are purely illustrative and may differ. Here, the PHY may handle partial width power management without link layer assist or intervention. In one embodiment, a blocking link state (BLS) protocol is utilized to enter the partial width transmitting state (PWTS). PWTS exit, in one or more implementations, may use the BLS protocol or squelch break detection. Due to absence of a forwarded clock, PWTLS exit may include a re-deskew, which maintains determinism of the link.

In one embodiment, HPI utilizes Tx adaptation. As an example, loopback state and hardware is used for Tx Adaptation. As on example, HPI is capable of counting actual bit errors; this may be able to be performed by injecting specialized patterns. As a result, HPI should be able to get better electrical margins at lower power. When using the loopback state, one direction may be used as a hardware backchannel with metrics sent as part of a training sequence (TS) payload.

In one embodiment, HPI is able to provide latency fixing without exchanging sync counter values in a TS. Other interconnect may perform latency fixing based on such exchanging of a sync counter value in each TS. Here, HPI may utilize periodically recurring Electrically Idle Exit Ordered Sets (EIEOS) as a proxy for the sync counter value by aligning the EIEOS to the sync counter. This potentially saves TS payload space, removes aliasing, and DC balance concerns, as well as simplify the calculation of latency to be added.

In one embodiment, HPI provides for software and timer control of a link state machine transitions. Other interconnect may support a semaphore (hold bit) that is set by hardware on entering an initialization state. Exit from the state occurs when the hold bit is cleared by software. HPI, in one implementation, allows software to control this type of mechanism for entering a transmitting link state or a loop back pattern state. In one embodiment, HPI allows for exit from handshake sates to be based on a software programmable timeout after handshake, which potentially makes test software easier.

In one embodiment, HPI utilizes Pseudo Random Bit Sequence (PRBS) scrambling of TS. As an example a 23-bit PRBS is utilized (PRBS23). In one embodiment, the PRBS is generated by a similar bit size, self-seeded storage element, such as a linear feedback shift register. As one example, a fixed UI pattern may be utilized to scramble with a bypass to an adaptation state. But by scrambling TS with PRBS23, Rx adaptation may be performed without the bypass. In addition, offset and other errors may be reduced during clock recovery and sampling. The HPI approach relies on using Fibonacci LFSRs which can be self seeded during specific portions of the TS.

In one embodiment, HPI supports an emulated slow mode without changing PLL clock frequency. Some designs may use separate PLLs for slow and fast speed. Yet, in on implementation, HPI use emulated slow mode (i.e. PLL clock runs at fast speed; TX repeats bits multiple times; RX oversamples to locate edges and identify the bit.). This means that ports sharing a PLL may coexist at slow and fast speeds. In one example where the multiple is an integer ratio of fast speed to slow speed, different fast speeds may work with the same slow speed, which may be used during the discovery phase of hot attach.

In one embodiment, HPI supports a common slow mode frequency for hot attach. Emulated slow mode, as described above, allows HPI ports sharing a PLL to coexist at slow and fast speeds. When a designer sets the emulation multiple as an integer ratio of fast speed to slow speed, then different fast speeds may work with the same slow speed. So, two agents which support at least one common frequency may be hot attached irrespective of the speed at which the host port is running Software discovery may then use the slow mode link to identify and setup the most optimal link speeds.

In one embodiment, HPI supports re-initialization of link without termination changes. One could provide re-initialization on an inband reset having clock lane terminations changed for the discovery process used in reliability, availability, and serviceability (RAS). In one embodiment, re-initialization for HPI may be done without changing the termination values when HPI includes a RX screening of incoming signaling to identify good lanes.

In one embodiment, HPI supports robust low power link state (LPLS) entry. As an example, HPI may include a minimum stay in LPLS (i.e. a minimum amount of time, UI, counter value, etc that a link stays in LPLS before an exit). Alternatively, LPLS entry may be negotiated and then use an inband reset to enter LPLS. But this may mask an actual inband reset originating from the second agent in some cases. HPI, in some implementations, allows a first agent to enter LPLS and a second agent to enter Reset. The first agent is unresponsive for a time period (i.e. the minimum stay), which allows the second agent to complete reset and then wake up the first agent, enabling a much more efficient, robust entry into LPLS.

In one embodiment, HPI supports features such as debouncing detect, wake and continuous screening for lane failures. HPI may look for a specified signaling pattern for an extended period of time to detect a valid wake from a LPLS thus reducing the chances of a spurious wake. The same hardware may also be used in the background for continuously screening for bad lanes during the initialization process making for a more robust RAS feature.

In one embodiment, HPI supports a deterministic exit for lock step and restart-replay. In HPI, some TS boundaries may coincide with flit boundaries when operating at full width. So HPI may identify and specify the exit boundaries such that lock-step behavior may be maintained with another link. In addition, HPI may specify timers which may be used to maintain lock step with a link pair. After initialization, HPI may also support operation with inband resets disabled to support some flavors of lock-step operation.

In one embodiment, HPI supports use of TS header instead of payload for key initialization parameters. Alternatively, TS payload may be used to exchange init parameters like ACKs and lane numbers. And DC levels for communicating lane polarity may also be used. Yet, HPI may use DC balanced codes in the TS header for key parameters. This potentially reduces the number of bytes needed for a payload and potentially allows for an entire PRBS23 pattern to be used for scrambling TS, which reduces the need for DC balancing the TS.

In one embodiment, HPI supports measures to increase noise immunity of active lanes during partial width transmitting link state (PWTLS) entry/exit of idle lanes. In one embodiment, null (or other non-retryable flits) flits may be used around the width change point to increase noise immunity of active lanes. Additionally, HPI may utilize null flits around the start of PWTLS exit (i.e. the null flits may be broken up with data flits). HPI may also use specialized signaling, whose format may be varied to reduce chances of false wake detects.

In one embodiment, HPI supports use of specialized patterns during PWTLS exit to allow non-blocking deskew. Alternatively, idle lanes may not be deskewed on PWTLS exit since they may maintain skew with help of a forwarded clock. Yet, with use of an embedded clock, HPI may use specialized signaling, whose format may be varied to reduce chances of false wake detects and also allow for deskew without blocking flit flow. This also allows for more robust RAS by seamlessly powering down failing lanes, re-adapting them, and bringing them back online without blocking the flow of flits.

In one embodiment, HPI supports low power link state (LPLS) entry without link layer support and more robust LPLS exit. Alternatively, link layer negotiation may be depended on between pre-designated master and slave to enter LPLS from transmitting link state (TLS). In HPI, the PHY may handle negotiation using blocking link state (BLS) codes and may support both agents being masters or initiators, as well as entry into LPLS directly from PWTLS. Exit from LPLS may be based on debouncing a squelch break using a specific pattern followed by handshake between the two sides and a timeout induced inband reset if any of this fails.

In one embodiment, HPI supports controlling unproductive looping during initialization. Alternatively, a failure to init (e.g. lack of good lanes) may result in retrying the init too many times, which potentially wastes power and is difficult to debug. In HPI, the link-pair may try to init a set number of times before calling it quits and powering down in a reset state, where software may make adjustments before retrying the init. This potentially improves the RAS of the system.

In one embodiment, HPI supports advanced IBIST (interconnect built in self test) options. In one embodiment, a pattern generator may be utilized, which allows for two non-correlated PRBS23 patterns of maximum length for any pin. In one embodiment, HPI may be able to support four such patterns, as well as provide the ability to control the length of these patterns (i.e. dynamically vary test pattern, PRBS23 length).

In one embodiment, HPI provides advanced logic to deskew lanes. As an example, the TS boundary after TS lock may be used to deskew the lanes. In addition, HPI may deskew by comparing lane PRBS patterns in the LFSR during specific points in the payload. Such deskew might be useful in testchips, which may lack ability to detect TS or state machines to manage the deskew.

In one embodiment, exit from init to link transmitting occurs on a TS boundary with planetary alignment. In addition, HPI may support a negotiated delay from that point. In addition, the order of exit between the two directions may be controlled by using master-slave determinism allowing for one instead of two planetary alignment controls for the link pair.

Some implementations use a fixed 128UI pattern to scramble TS. Others use a fixed 4 k PRBS23 to scramble TS. HPI, in one embodiment, allows for using any length PRBS including an entire (8M-1) PRBS23 sequence.

In some architectures adaptation is of fixed duration. In one embodiment, the exit from Adapt is handshaked rather than timed. This means that Adapt times may be asymmetric between the two directions and as long as needed by either side.

In one embodiment, a state machine may bypass states if those state actions don't need to be redone. However, this may lead to more complex designs and validation escapes. HPI doesn't use bypasses—instead it distributes actions such that short timers in each state may be used to perform the actions and bypasses avoided. This potentially makes for more uniform and synchronized state machine transitions.

In some architectures, forwarded clock is utilized for Inband reset and link layer for staging partial width transmitting and for low power link entry. HPI uses block linking state codes similar functions. These codes potentially could have bit errors leading to 'mismatches' at Rx. HPI includes a protocol for dealing with mismatches as well as means to handle asynchronous reset, low power link state and partial width link state requests.

In one embodiment, a 128 UI scrambler is utilized for loopback TS. However, this can lead to aliasing for TS lock when loopback begins; so some architecture's changes the payload to all 0s during this. In another embodiment, HPI utilizes a uniform payload and uses the periodically occurring unscrambled EIEOS for TS lock.

Some architecture utilize scrambled TS during init. In one embodiment, HPI defines supersequences that are combinations of scrambled TS of various lengths and unscrambled EIEOS. This allows more randomized transitions during init and also simplifies TS lock, latency fixing, and other actions.

HPI Link Layer

Returning to FIG. 2, an embodiment of a logical block for link layer 210a,b is illustrated. In one embodiment, Link Layer 210a,b guarantees reliable data transfer between two protocol or routing entities. It abstracts Physical layer 205a,b from the Protocol layer 220a,b, is responsible for the flow control between two protocol agents (A, B), and provides virtual channel services to the Protocol layer (Message Classes) and Routing layer (Virtual Networks). The interface between the Protocol layer 220a,b and the Link Layer 210a,b is typically at the packet level. In one embodiment, the smallest transfer unit at the Link Layer is referred to as a flit which a specified number of bits, such as 192. The Link Layer 210a,b relies on the Physical layer 205a,b to frame the Physical layer 205a,b's unit of transfer (phit) into the Link Layer 210a,b' unit of transfer (flit). In addition, the Link Layer 210a,b may be logically broken into two parts, a sender and a receiver. A sender/receiver pair on one entity may be connected to a receiver/sender pair on another entity. Flow Control is often performed on both a flit and a packet basis. Error detection and correction is also potentially performed on a flit level basis.

In one embodiment, flits are expanded 192 bits. However, any range of bits, such as 81-256 (or more) may be utilized in different variations. Here, the CRC field is also increased (e.g. 16 bits) to handle a larger payload.

In one embodiment, TIDs (Transaction IDs) are 11 bits in length. As a result, pre-allocation and the enabling of distributed home agents may be removed. Furthermore, use of 11 bits, in some implementations, allows for the TID to be used without having use for an extended TID mode.

In one embodiment, header flits are divided into 3 slots, 2 with equal size (Slots 0 and 1) and another smaller slot (Slot 2). A floating field may be available for one of Slot 0 or 1 to use. The messages that can use slot 1 and 2 are optimized, reducing the number of bits needed to encode these slots' opcodes. When a header needing more bits that Slot 0 provides enters the link layer, slotting algorithms are in place to allow it to take over Slot 1 payload bits for additional space. Special control (e.g. LLCTRL) flits may consume all 3 slots worth of bits for their needs. Slotting algorithms may also exist to allow individual slots to be utilized while other slots carry no information, for cases where the link is partially busy. Other interconnect may allow a single message per flit, instead of multiple. The sizing of the slots within the flit, and the types of messages that can be placed in each slot, potentially provide the increased bandwidth of HPI even with a reduced flit rate. For a more detailed description of flits and the multi-slot header, refer to the flit definition section of Appendix B.

In HPI, a large CRC baseline may improve error detection. For example, a 16 bit CRC is utilized. As a result of the larger CRC, a larger payload may also be utilized. The 16 bits of CRC in combination with a polynomial used with those bits improves error detection. As an example, the are a minimum number of gates to provide 1) 1-4 bit errors detected 2) errors of burst length 16 or less are detected.

In one embodiment, a rolling CRC based on two CRC-16 equations is utilized. Two 16 bit polynomials may be used, the polynomial from HPI CRC-16 and a second polynomial. The second polynomial has the smallest number of gates to implement while retaining the properties of 1) all 1-7 bit errors detected 2) per lane burst protection in x8 link widths 3) all errors of burst length 16 or less are detected.

In one embodiment, a reduced max flit rate (9.6 versus 4 UI) is utilized, but increased throughput of the link is obtained. As a result of the increased flit size, introduction of multiple slots per flit, optimized utilization of payload bits (changed algorithms to remove or relocate infrequently used fields), more interconnect efficiency is achieved.

In one embodiment, part of the support for 3 slots includes 192 bit flit. The floating field enables 11 extra bits of payload for either slot 0 or slot 1. Note if a larger flit is used more floating bits may be used. And as a corollary, if a smaller flit is used, then less floating bits are provided. By allowing a field to float between the two slots, we can provide the extra bits needed for certain messages, while still staying within 192 bits and maximizing the utilization of the bandwidth. Alternatively, providing an 11 bit HTID field to each slot may use an extra 11 bits in the flit which would not be as efficiently utilized.

Some interconnects may transmit Viral status in protocol level messages and Poison status in data flits. In one embodiment, HPI protocol level messages and Poison status are moved to control flits. Since these bits are infrequently used (only in the case of errors), removing them from the protocol level messages potentially increases flit utilization. Injecting them using control flits still allows containment of the errors.

In one embodiment, CRD and ACK bits in a flit allow return of a number of credits, such as eight, or the number of acks, such as 8. As part of the fully encoded credit fields, these bits are utilized as Credit[n] and Acknowledge[n] when Slot 2 is encoded as LLCRD. This potentially improves efficiency by allowing any flit to return the number of VNA Credits and the number of Acknowledges using a total of only 2 bits, but also allowing their definitions to remain consistent when a fully encoded LLCRD return is used.

In one embodiment, VNA vs. VN0/1 encoding (saves bits by aligning slots to same encoding). The slots in a multi-slot header flit may be aligned to just VNA, just VN0, or just VN1. By enforcing this, per slot bits indicating VN are removed. This increases the efficiency of flit bit utilization and potentially enables expanding from 10 bit TIDs to 11 bit TIDs.

Some fields only allow return in increments of 1 (for VN0/1), 2/8/16 (for VNA), and 8 (for Acknowledge). This means that returning a large number of pending Credits or Acknowledges may use multiple return messages. It also means that odd numbered return values for VNA and Acknowledge may be left stranded pending accumulation of an evenly divisible value. HPI may have fully encoded Credit and Ack return fields, allowing an agent to return all accumulated Credits or Acks for a pool with a single message. This potentially improves link efficiency and also potentially simplifies logic implementation (return logic can implement a "clear" signal rather than a full decrementer)

Routing Layer

In one embodiment, Routing layer 215a,b provides a flexible and distributed method to route HPI transactions from a source to a destination. The scheme is flexible since routing algorithms for multiple topologies may be specified through programmable routing tables at each router (the programming in one embodiment is performed by firmware, software, or a combination thereof). The routing functionality may be distributed; the routing may be done through a series of routing steps, with each routing step being defined through a lookup of a table at either the source, intermediate, or destination routers. The lookup at a source may be used to inject a HPI packet into the HPI fabric. The lookup at an intermediate router may be used to route an HPI packet from an input port to an output port. The lookup at a destination port may be used to target the destination HPI protocol agent. Note that the Routing layer, on some implementations, is thin since the routing tables, and, hence the routing algorithms, are not specifically defined by specification. This allows a variety of usage models, including flexible platform architectural topologies to be defined by the system implementation. The Routing layer 215a,b relies on the Link layer 210a,b for providing the use of up to three (or more) virtual networks (VNs)—in one example, two deadlock-free VNs, VN0 and VN1 with several message classes defined in each virtual network. A shared adaptive virtual network (VNA) may be defined in the link layer, but this adaptive network may not be exposed directly in Routing Concepts, since each Message class and VN may have dedicated resources and guaranteed forward progress.

A non-exhaustive, exemplary list of routing rules includes: (1) (Message class invariance): An incoming packet belonging to a particular message class may berouted on an outgoing HPI port/virtual network in the same message class; (2) (Switching) HPI platforms may support the "store-and-forward" and "virtual cut through" types of switching. In another embodiment, HPI may not support "wormhole" or "circuit" switching. (3) (Interconnect deadlock freedom) HPI platforms may not rely on adaptive flows for deadlock-free routing. With platforms, which use both VN0 and VN1, the 2 VNs together may be used for deadlock-free routing; and (4) (VN0 for "leaf" routers). In HPI platforms, which may use both VN0 and VN1, it is permissible to use VN0 for those components, whose routers are not used route-through; that is, incoming ports have HPI destinations that terminate at this component. In such a case, packets from different VNs can be routed to VN0. Other rules (for example, movement of packets between VN0 and VN1) may be governed by a platform dependent routing algorithm.

Routing step: A routing step, in one embodiment, is referred to by a routing function (RF) and a selection function (SF). The routing function may take, as inputs, a HPI port at which a packet arrives and a destination NodeID; it then yields as output a 2-tuple—the HPI port number and the virtual network—which the packet should follow on its path to the destination. It is permitted for the routing function to be additionally dependent on the incoming virtual network. Further, it is permitted with the routing step to yield multiple <port#, virtual network> pairs. The resulting routing algorithms are called adaptive. In such a case, a selection function SF may choose a single 2-tuple based on additional state information which the router has (for example, with adaptive routing algorithms, the choice of a particular port of virtual network may depend on the local congestion conditions). A routing step, in one embodiment, consists of applying the routing function and then the selection function to yield the 2-tuple(s).

Router Table Simplifications: HPI platforms may implement legal subsets of the virtual networks. Such subsets simplify the size of the routing table (reduce the number of columns) associated virtual channel buffering and arbitration at the router switch. These simplifications ay come at the cost of platform flexibility and features. VN0 and VN1 may be deadlock-free networks which provide deadlock freedom either together or singly, depending on the usage model, usually with minimal virtual channel resources assigned to them. Flat organization of the routing table may include a size corresponding to the maximum number of NodeIDs. With such an organization, the routing table may be indexed by the destination NodeID field and possibly by the virtual network id field. The table organization can also be made hierarchical with the destination NodeID field being sub-divided into multiple sub-fields, which is implementation dependent. For example, with a division into "local" and "non-local" parts, the "non-local" part of the routing is completed before the routing of the "local" part. The potential advantage of reducing the table size at every input port comes at the potential cost of being forced to assign NodeIDs to HPI components in a hierarchical manner Routing Algorithm: A routing algorithm, in one embodiment, defines the set of permissible paths from a source module to a destination module. A particular path from the source to the destination is a subset of the permissible paths and is obtained as a series of routing steps defined above starting with the router at the source, passing through zero or more intermediate routers, and ending with the router at the destination. Note that even though an HPI fabric may have multiple physical paths from a source to a destination, the paths permitted are those defined by the routing algorithm.

HPI Coherence Protocol

In one embodiment, the HPI Coherence Protocol is included in layer 220a,b is to support agents caching lines of data from memory. An agent wishing to cache memory data may use the coherence protocol to read the line of data to load into its cache. An agent wishing to modify a line of data in its cache may use the coherence protocol to acquire ownership of the line before modifying the data. After modifying a line, an agent may follow protocol requirements of keeping it in its cache until it either writes the line back to memory or includes the line in a response to an external request. Lastly, an agent may fulfill external requests to invalidate a line in its cache. The protocol ensures coherency of the data by dictating the rules all caching agents may follow. It also provides the means for agents without caches to coherently read and write memory data.

Two conditions may be enforced to support transactions utilizing the HPI Coherence Protocol. First, the protocol maintains data consistency, as an example on a per-address basis, among data in agents' caches and between those data and the data in memory. Informally, data consistency may refer to each valid line of data in an agent's cache representing a most up-to-date value of the data and data transmitted in a coherence protocol packet represents the most up-to-date value of the data at the time it was sent. When no valid copy of the data exists in caches or in transmission, the protocol may ensure the most up-to-date value of the data resides in memory. Second, the protocol provides well-defined commitment points for requests. Commitment points for reads may indicate when the data is usable; and for writes they may indicate when the written data is globally observable and will be loaded by subsequent reads. The protocol may support these commitment points for both cacheable and uncacheable (UC) requests in the coherent memory space.

The HPI Coherence Protocol also may ensure the forward progress of coherence requests made by an agent to an address in the coherent memory space. Certainly, transactions may eventually be satisfied and retired for proper system operation. The HPI Coherence Protocol, in some embodiments, may have no notion of retry for resolving resource allocation conflicts. Thus, the protocol itself may be defined to contain no circular resource dependencies, and implementations may take care in their designs not to introduce dependencies that can result in deadlocks. Additionally, the protocol may indicate where designs are able to provide fair access to protocol resources.

Logically, the HPI Coherence Protocol, in one embodiment, consists of three items: coherence (or caching) agents, home agents, and the HPI interconnect fabric connecting the agents. Coherence agents and home agents work together to achieve data consistency by exchanging messages over the interconnect. The link layer 210a,b and its related description provides the details of the interconnect fabric including how it adheres to the coherence protocol's requirements, discussed herein. (It may be noted that the division into coherence agents and home agents is for clarity. A design may contain multiple agents of both types within a socket or even combine agents behaviors into a single design unit.).

In one embodiment, HPI does not pre-allocate resources of a Home Agent. Here, a Receiving Agent receiving a request allocates resource to process it. An Agent sending a request allocates resources for responses. In this scenario, HPI may follow two general rules regarding resource allocation. First, an agent receiving a request may be responsible for allocating the resource to process it. Second, an agent generating a request may be responsible for allocating resources to process responses to the request.

For allocation of resources may also extend to HTID (along with RNID/RTID) in snoop requests The potential reduction of using a home agent and forward responses to support responses to Home Agent (and data forwarding to requesting agent).

In one embodiment, home agent resources are also not pre-allocated in snoop requests and forward responses to support responses to the home agent (and data forwarding to the requesting agent.

In one embodiment, there is no pre-allocation of Home resources Ability to send CmpO "early", before Home Agent is finished processing request, when it is safe for requesting agent to reuse its RTID resource. General handling of snoops with similar RNID/RTID in system also part of protocol.

In one embodiment, conflict resolution is performed using an ordered response channel. A Coherence Agent uses RspCnflt as request for a Home Agent to send a FwdCnfltO, which will be ordered with the CmpO (if any already scheduled) for the Coherence Agent's conflicting request.

In one embodiment, HPI supports conflict resolution via an ordered response channel. A Coherence Agent using information from snoop to aid in processing FwdCnfltO, which has no "type" information and no RTID for forwarding data to requesting agent.

In one embodiment, a Coherence Agent blocks forwards for writeback requests to maintain data consistency. But it also allows Coherence Agent to use a writeback request to commit uncacheable (UC) data before processing forward and allows the Coherence Agent to writeback partial cache lines instead of protocol supporting a partial implicit writeback for forwards.

In one embodiment, a read invalidate (RdInv) request accepting Exclusive-state data is supported. Semantics of uncacheable (UC) reads include flushing modified data to memory. Some architecture, however, allowed forwarding M data to invalidating reads, which forced the requesting agent to clean the line if it received M data. The RdInv simplifies the flow but it does not allow E data to be forwarded.

In one embodiment, HPI support an InvItoM to IODC functionality. An InvItoM requests exclusive ownership of a cache line without receiving data and with the intent of performing a writeback soon afterward. A required cache state may be an M state, and E state, or either.

In one embodiment, HPI supports a WbFlush for persistent memory flush. An embodiment of a WbFlush is illustrated below. It may be sent as a result of a persistent commit. May flush write to persistent memory.

In one embodiment, HPI supports additional operations, such as SnpF for "fanout" snoops generated by the Routing Layer. Some architectures don't have explicit support for fanout snoops. Here, a HPI Home agent generates single "fanout" snoop request and, in response, the Routing Layer generates snoops to all peer agents in the "fanout cone". Home agent may expect snoop responses from each of the agent Sections.

In one embodiment, HPI supports additional operations, such as SnpF for "fanout" snoops generated by the Routing Layer. Some architectures don't have explicit support for fanout snoops. Here, a HPI Home agent generates single "fanout" snoop request and, in response, the Routing Layer generates snoops to all peer agents in the "fanout cone". Home agent may expect snoop responses from each of the agent Sections.

In one embodiment, HPI supports an explicit writeback with cache-push hint (WbPushMtoI). In one embodiment, a Coherence Agent writes back modified data with a hint to Home Agent that it may push the modified data to a "local" cache, storing in M state, without writing the data to memory.

In one embodiment, a Coherence Agent may keep F state when forwarding shared data. In on example, a Coherence Agent with F state that receives a "sharing" snoop or forward after such a snoop may keep the F state while sending S state to the requesting agent.

In one embodiment, protocol tables may be nested by having one table refer to another sub-table in the "next state" columns, and the nested table can have additional or finer-grained guards to specify which rows (behaviors) are permitted.

In one embodiment, Protocol tables use row spanning to indicate equally permissible behaviors (rows) instead of adding "Bias" bits to select among behaviors.

In one embodiment, action tables are organized for use as functionality engine for BFM (validation environment tool) rather than having BFM team create their own BFM engine based upon their interpretation.

HPI Non-Coherent Protocol

In one embodiment, HPI supports non-coherent transactions. As an example, a non-coherent transaction is referred to as one that does not participate in the HPI coherency protocol. Non-coherent transactions comprise requests and their corresponding completions. For some special transactions, a broadcast mechanism.

Centering in HPI

In one embodiment, when the HPI is brought up from a powered-down state, the link must be "trained" before it can function at its top capacity. This is because values may "drift" over time and between varying conditions, such as temperature. With a high-speed link like HPI, it is necessary to have signals properly centered in both the time domain and the voltage domain to avoid bit errors that may be introduced by parameter drift.

Training may include "centering" or "recentering" the clock to ensure that signals are properly centered in both the time domain and voltage domain. At a given speed, the clock has a window in which a sample of a data line will yield a correct value. Sampling outside the window may yield a bit error. The faster the clock, the smaller the window, and vice versa. Thus, an important aspect of training in one example, and especially in a high-speed interconnect with a narrow window, is shifting the Vref and phase of the clock so that data are sampled at or near the center of the window to minimize bit errors. However, with a two-dimensional parameter shift as described herein, challenges arise in selecting the optimal value on both axes.

In one example, training includes operating the HPI at a reduced speed initially, such as half speed, feeding the HPI a known value such as a PRBS, and then sampling back the bit pattern. After a sample, the clock may be shifted either in the voltage domain (Vref) or in the time domain (phase). The HPI detects when bit errors begin to occur, thus probing the boundaries of the eye.

Centering may include a combination of both hardware and software (running, for example, from a basic input-output system (BIOS) chip). In one example, hardware is provided for basic or initial centering operations, which may provide a rough centering solution. Software may then be used to supplement and refine the initial centering. Software centering provides additional flexibility, and in some cases provides greater programmability of logic as compared to hardware centering. This can address issues such as, for example, hardware centering finding what it believes is a "near center" for the eye, when in fact an even nearer center is available via additional passes.

In one example, the hardware includes 32 quantized delay settings for phase adjustment, though any number may be provided. Vref settings may be similarly quantized.

Testing involves a sweep of a quantized setting across each lane. After each sweep, an error detector enumerates the number of circular redundancy check (CRC) errors, if any, that were encountered during the sweep. In one example, each sweep is aggregated. Thus, the sweep is scored not on the number of CRC errors on each lane, but the number of CRC errors on all lanes. This means that in some cases, a setting that is the best for an individual lane may not be the best for the interconnect as a whole.

The phase sweep may be performed in hardware at initial bootup, and may be used to perform a rough centering. After the sweep is complete, software instructions may be loaded from BIOS to continue refining centering.

In a second phase, performed in one example in software, the Vref value is similarly swept across quantized settings. As before, each sweep results in zero or more CRC errors, and the result of each quantized setting is aggregated. This sweep is performed at operational speed (8 Ghz in one example) to ensure that the results are valid for operational speeds.

In a third phase, software may construct a two-dimensional "eye," or a zone based on a cross section of the optimal values identified in the first two phases. The eye is an oblong or ovular zone of "best guess values." In this phase, phase and Vref are tested together, and the result of each phase and reference voltage pair is compared to every other phase and reference voltage pair.

Optimality decisions within the eye may be non-trivial, since eye opening may be asymmetric, non-monotonic around the major inflection points, and somewhat time-variant. This is an example of Tx adaptation, i.e. Tx values are adjusted based on remote Rx metrics which are made available to Tx on a backchannel. In HPI software typically running on a core on the upstream die can access the local die and remote die using the HPI sideband, which serves as the backchannel. In HPI, such adaptation happen in both directions simultaneously since the backchannel is not on the same wire as the link layer.

Figure 4:
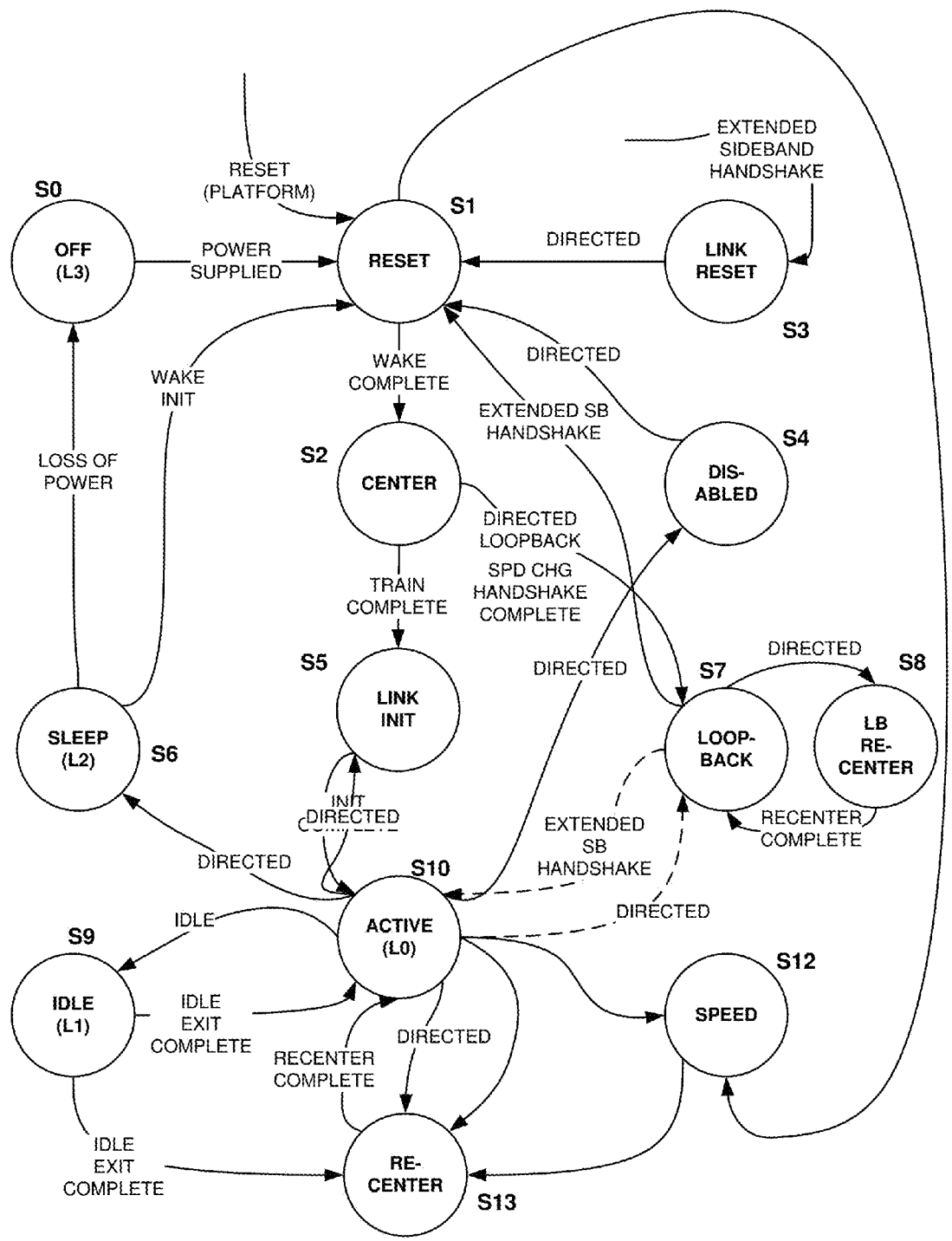
FIG. 4 illustrates a state machine of a high-performance interconnect.

FIG. 4 is a more detailed link state machine diagram, illustrating at least some of the link states and link state transitions that can be included in an example HPI controller. In some implementations, an example link state machine can include, among the other states and state transitions illustrated in FIG. 4, a "Directed Loopback" transition can be provided to place the lanes into a digital loopback. For instance, the receiver lanes can be looped back to the transmitter lanes after the clock recovery circuits. A "Center" and an "LB_Recenter" state can also be provided in some instances, which can be used to align the data symbols as described in this Specificatoin.

Figure 5:
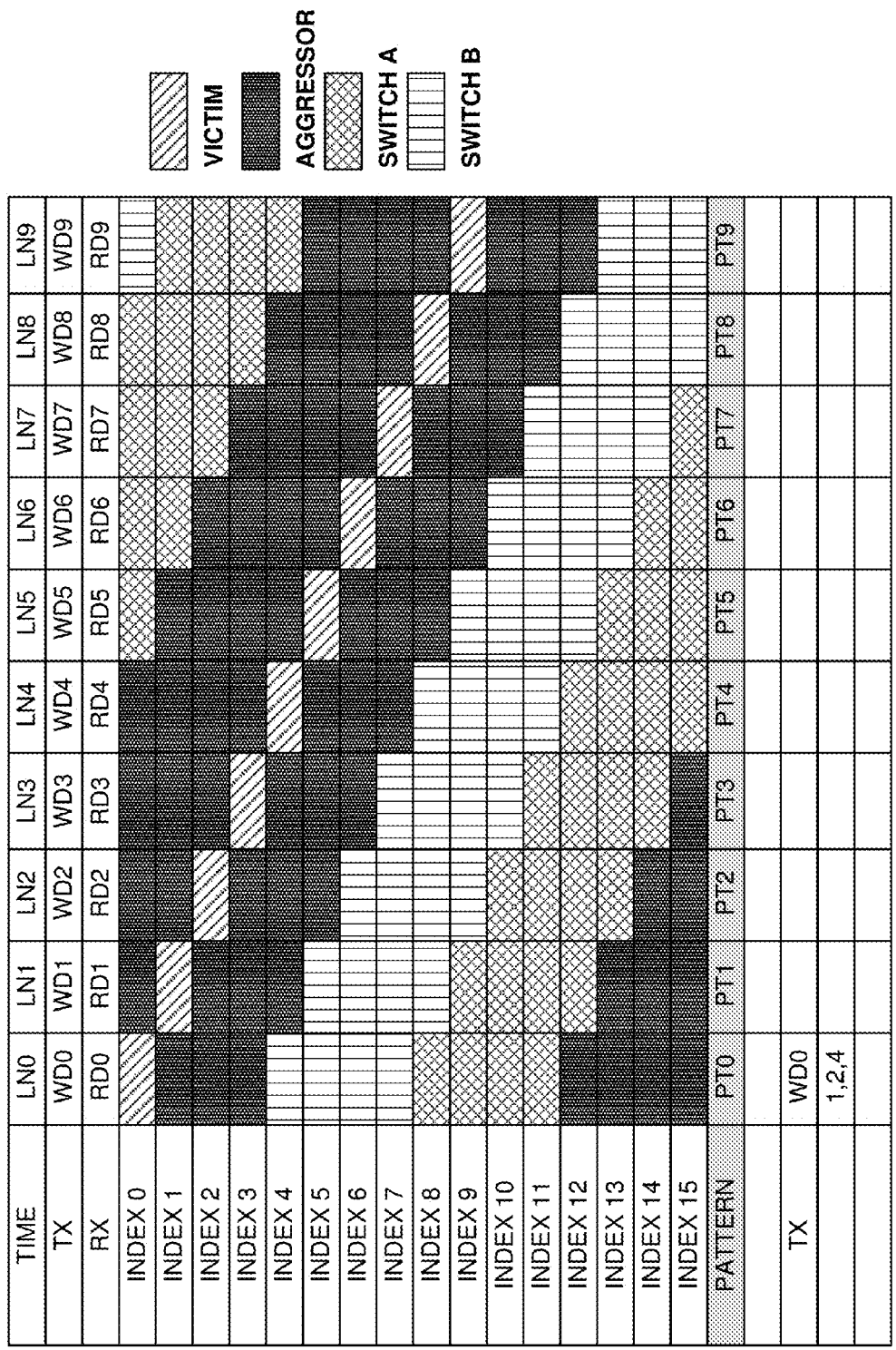
FIGS. 5 and 5A illustrate test patterns for centering.
Figure 5A:

The error detection described above may be enhanced by providing a cross-talk pattern, as illustrated in FIGS. 5 and 5A. It can be seen in this example that a test of one lane comprises selecting that lane as a "victim" lane. A test pattern may be driven on that lane, including for example and PRBS. Adjacent lanes, as well as lanes up to n lanes away (in this example, n=4) are "aggressor" lanes. These lanes receive a crosstalk pattern, which in this case is a logical inverse of the test pattern. Remaining lanes are neutral.

Figure 6:
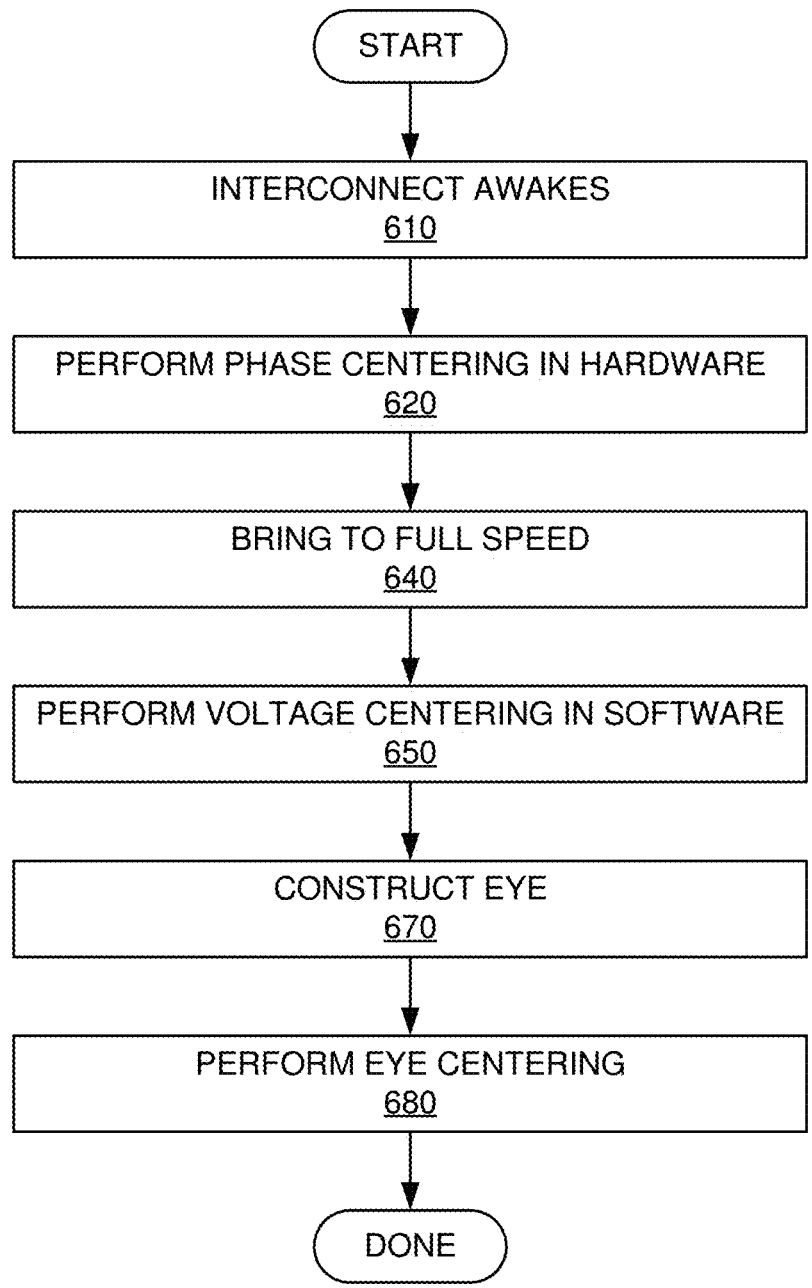
FIG. 6 is a flow chart of a method for centering.

FIG. 6 is a flow chart of centering as described in this Specification.

In block 610, the interconnect awakes, such as coming up for boot after a machine has been turned off.

In block 620, the interconnect performs initial phase centering as described above. This may include performing a phase sweep in hardware, and selecting the setting that results in the fewest overall CRC bit errors.

In block 640, once rough phase centering is completed in hardware, the HPI may be brought to its full speed.

In block 650, the software may perform voltage centering. In certain examples, the software may also refine phase centering as described herein.

In block 670, an eye is constructed in software.

In block 680, eye centering is performed. As described above, this is a two-dimensional centering method, in which phase and reference voltage pairs are selected and compared to one another. The method is then done.

In certain examples, an operation known as "recentering" may also occur. In recentering, flits stop, and phits take over the interconnect. Because of this, and because centering may take several microseconds (unacceptably slow for an HPI in certain embodiments), recentering cannot be performed on a periodic basis, as in certain other interconnects. Rather, recentering may be episodic.

Specifically, recentering may occur when an error tracker in the HPI link layer detects that the number of CRC errors received in a span of time is greater than a threshold value. For example, a CRC error once every $10^{12}$ bits may be acceptable. But more than that may be an indication of a true error. Thus, the receiving agent may send a sideband message informing the transmitting agent that recentering is necessary. When that occurs, the sending agent acknowledges the message, and the two agents enter recentering.

The message on the sideband may be a link control packet (LCP), which is a special class of packets sent on the HPI sideband. The sideband may operate at a speed orders of magnitude slower than the link layer. For example, the HPI sideband may operate at 100 to 400 MHz.

In certain example, recentering may be hardware only, as the BIOS may not be available when recentering occurs.

Some R-link designs may opt to do low frequency or continuous CDR tracking using signaling on the data lanes which consists of flits/packets which are scrambled with a PRBS23. During quiet periods when there is not enough packets, the PHY could insert dummy LCPs so the tracking can be maintained.

Note that the apparatus', methods', and systems described above may be implemented in any electronic device or system as aforementioned. As specific illustrations, the figures below provide exemplary systems for utilizing the invention as described herein. As the systems below are described in more detail, a number of different interconnects are disclosed, described, and revisited from the discussion above. And as is readily apparent, the advances described above may be applied to any of those interconnects, fabrics, or architectures.

Figure 7:
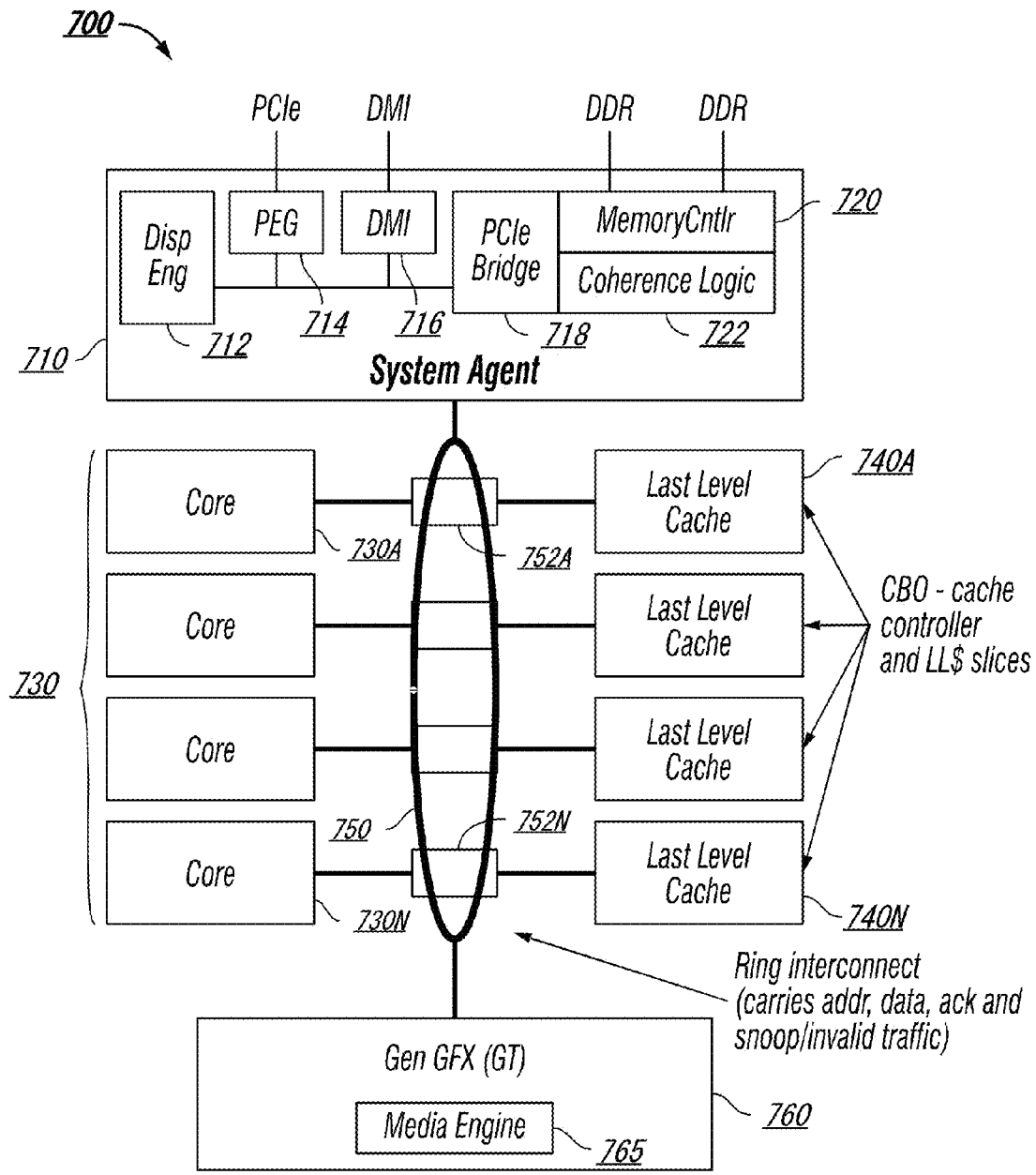
FIG. 7 illustrates an embodiment of a block diagram of a multicore processor.

Referring now to FIG. 7, shown is a block diagram of an embodiment of a multicore processor. As shown in the embodiment of FIG. 7, processor 700 includes multiple domains. Specifically, a core domain 730 includes a plurality of cores 730A-730N, a graphics domain 760 includes one or more graphics engines having a media engine 765, and a system agent domain 710.

In various embodiments, system agent domain 710 handles power control events and power management, such that individual units of domains 730 and 760 (e.g. cores and/or graphics engines) are independently controllable to dynamically operate at an appropriate power mode/level (e.g. active, turbo, sleep, hibernate, deep sleep, or other Advanced Configuration Power Interface like state) in light of the activity (or inactivity) occurring in the given unit. Each of domains 730 and 760 may operate at different voltage and/or power, and furthermore the individual units within the domains each potentially operate at an independent frequency and voltage. Note that while only shown with three domains, understand that the scope of the present invention is not limited in this regard and additional domains may be present in other embodiments.

As shown, each core 730 further includes low level caches in addition to various execution units and additional processing elements. Here, the various cores are coupled to each other and to a shared cache memory that is formed of a plurality of units or slices of a last level cache (LLC) 740A-740N; these LLCs often include storage and cache controller functionality and are shared amongst the cores, as well as potentially among the graphics engine too.

As seen, a ring interconnect 750 couples the cores together, and provides interconnection between the core domain 730, graphics domain 760 and system agent circuitry 710, via a plurality of ring stops 752A-752N, each at a coupling between a core and LLC slice. As seen in FIG. 7, interconnect 750 is used to carry various information, including address information, data information, acknowledgement information, and snoop/invalid information. Although a ring interconnect is illustrated, any known on-die interconnect or fabric may be utilized. As an illustrative example, some of the fabrics discussed above (e.g. another on-die interconnect, Intel On-chip System Fabric (IOSF), an Advanced Microcontroller Bus Architecture (AMBA) interconnect, a multi-dimensional mesh fabric, or other known interconnect architecture) may be utilized in a similar fashion.

As further depicted, system agent domain 710 includes display engine 712 which is to provide control of and an interface to an associated display. System agent domain 710 may include other units, such as: an integrated memory controller 720 that provides for an interface to a system memory (e.g., a DRAM implemented with multiple DIMMs; coherence logic 722 to perform memory coherence operations. Multiple interfaces may be present to enable interconnection between the processor and other circuitry. For example, in one embodiment at least one direct media interface (DMI) 716 interface is provided as well as one or more PCIe™ interfaces 714. The display engine and these interfaces typcally couple to memory via a PCIe™ bridge 718. Still further, to provide for communications between other agents, such as additional processors or other circuitry, one or more other interfaces (e.g. an Intel® Quick Path Interconnect (QPI) fabric) may be provided.

Figure 8:
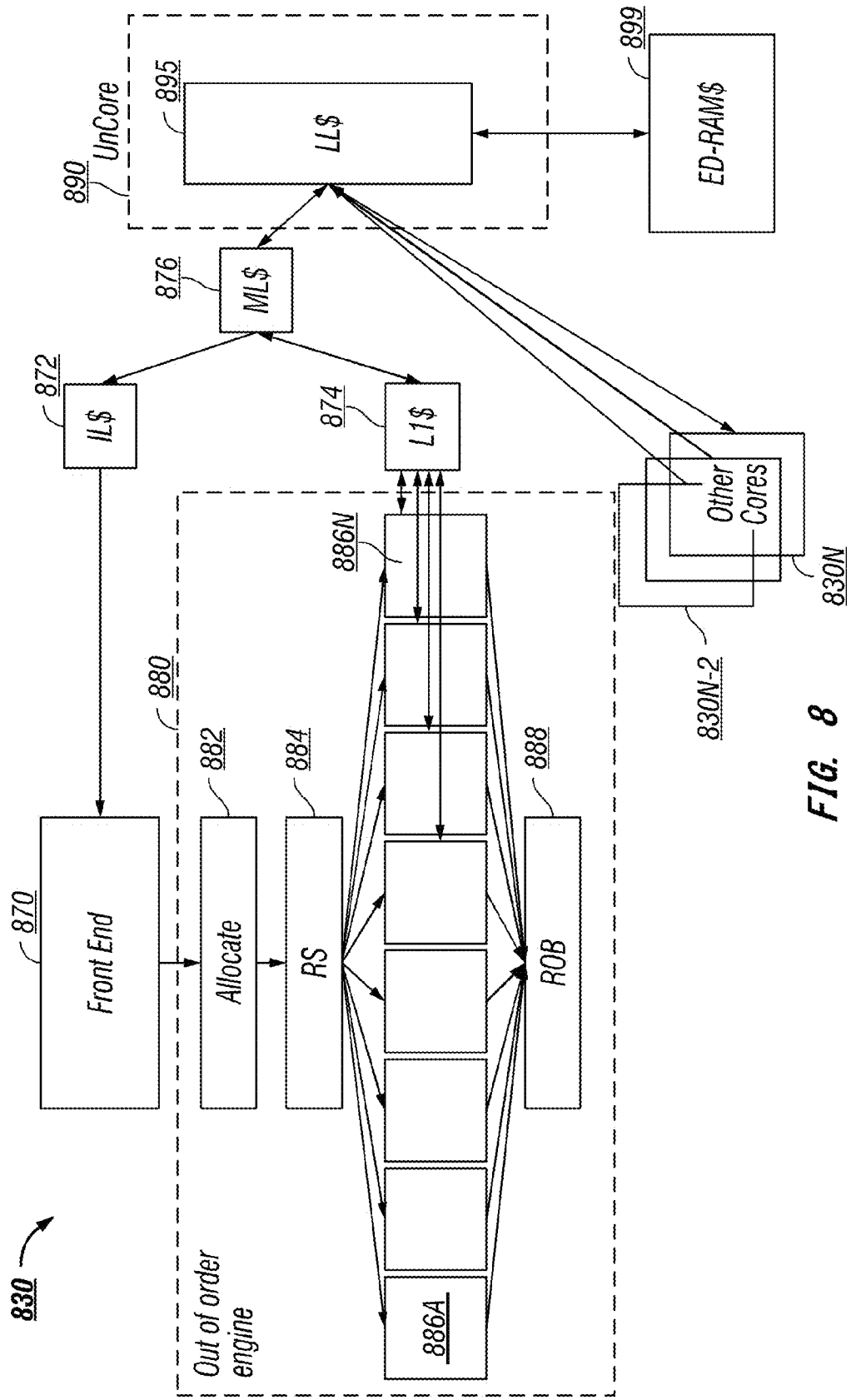
FIG. 8 illustrates an embodiment of a block diagram for a processor.

Referring now to FIG. 8, shown is a block diagram of a representative core; specifically, logical blocks of a back-end of a core, such as core 730 from FIG. 7. In general, the structure shown in FIG. 8 includes an out-of-order processor that has a front end unit 870 used to fetch incoming instructions, perform various processing (e.g. caching, decoding, branch predicting, etc.) and passing instructions/operations along to an out-of-order (OOO) engine 880. OOO engine 880 performs further processing on decoded instructions.

Specifically in the embodiment of FIG. 8, out-of-order engine 880 includes an allocate unit 882 to receive decoded instructions, which may be in the form of one or more micro-instructions or uops, from front end unit 870, and allocate them to appropriate resources such as registers and so forth. Next, the instructions are provided to a reservation station 884, which reserves resources and schedules them for execution on one of a plurality of execution units 886A-886N. Various types of execution units may be present, including, for example, arithmetic logic units (ALUs), load and store units, vector processing units (VPUs), floating point execution units, among others. Results from these different execution units are provided to a reorder buffer (ROB) 888, which take unordered results and return them to correct program order.

Still referring to FIG. 8, note that both front end unit 870 and out-of-order engine 880 are coupled to different levels of a memory hierarchy. Specifically shown is an instruction level cache 872, that in turn couples to a mid-level cache 876, that in turn couples to a last level cache 895. In one embodiment, last level cache 895 is implemented in an on-chip (sometimes referred to as uncore) unit 890. As an example, unit 890 is similar to system agent 710 of FIG. 7. As discussed above, UnCore 890 communicates with system memory 899, which, in the illustrated embodiment, is implemented via ED RAM. Note also that the various execution units 886 within out-of-order engine 880 are in communication with a first level cache 874 that also is in communication with mid-level cache 876. Note also that additional cores 830N-2-830N can couple to LLC 895. Although shown at this high level in the embodiment of FIG. 8, understand that various alterations and additional components may be present.

Figure 9:
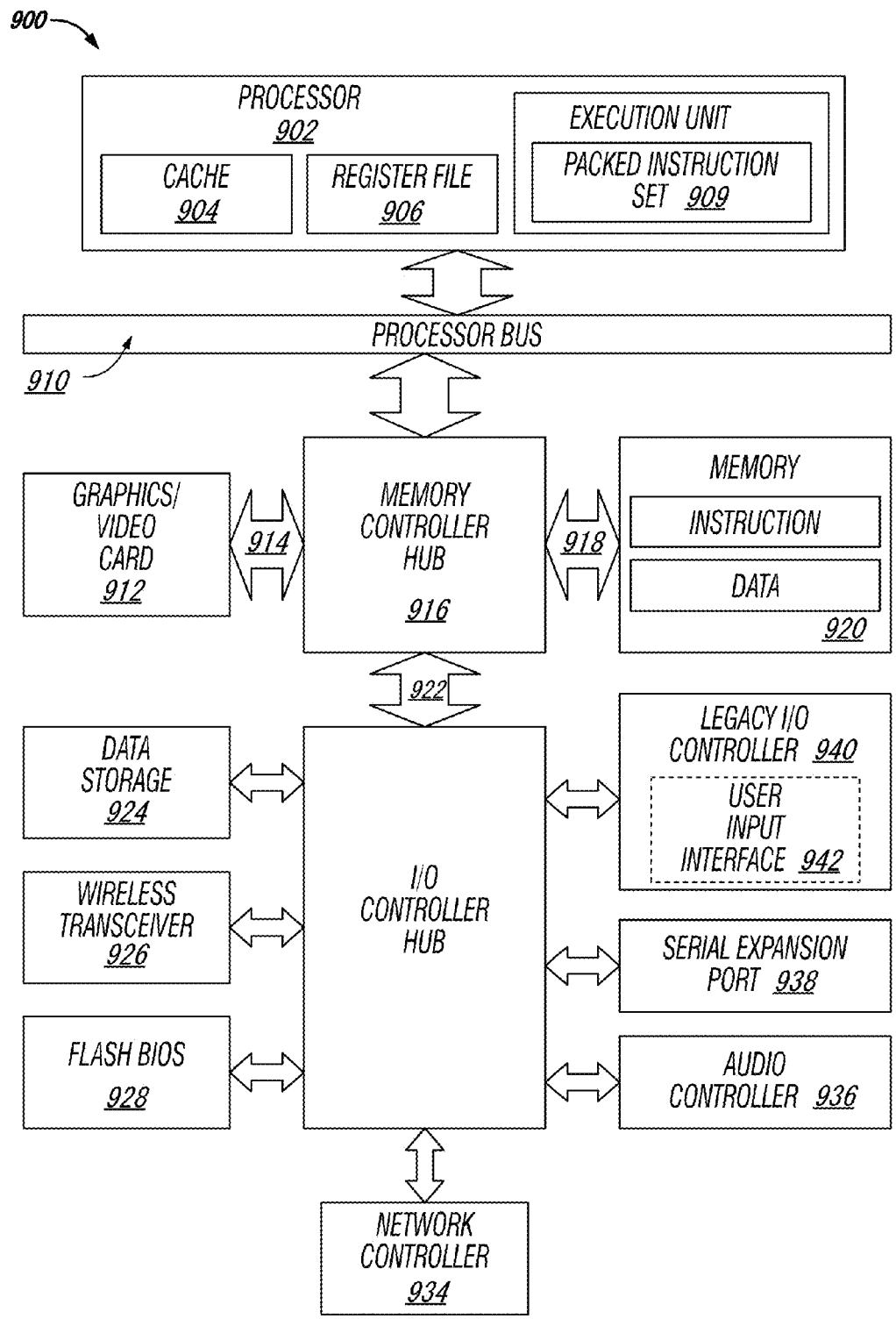
FIG. 9 illustrates another embodiment of a block diagram for a computing system including a processor.

Turning to FIG. 9, a block diagram of an exemplary computer system formed with a processor that includes execution units to execute an instruction, where one or more of the interconnects implement one or more features in accordance with one embodiment of the present invention is illustrated. System 900 includes a component, such as a processor 902 to employ execution units including logic to perform algorithms for process data, in accordance with the present invention, such as in the embodiment described herein. System 900 is representative of processing systems based on the PENTIUM III™, PENTIUM 4™, Xeon™, Itanium, XScale™ and/or StrongARM™ microprocessors available from Intel Corporation of Santa Clara, Calif., although other systems (including PCs having other microprocessors, engineering workstations, set-top boxes and the like) may also be used. In one embodiment, sample system 900 executes a version of the WINDOWS™ operating system available from Microsoft Corporation of Redmond, Wash., although other operating systems (UNIX and Linux for example), embedded software, and/or graphical user interfaces, may also be used. Thus, embodiments of the present invention are not limited to any specific combination of hardware circuitry and software.

Embodiments are not limited to computer systems. Alternative embodiments of the present invention can be used in other devices such as handheld devices and embedded applications. Some examples of handheld devices include cellular phones, Internet Protocol devices, digital cameras, personal digital assistants (PDAs), and handheld PCs. Embedded applications can include a micro controller, a digital signal processor (DSP), system on a chip, network computers (NetPC), set-top boxes, network hubs, wide area network (WAN) switches, or any other system that can perform one or more instructions in accordance with at least one embodiment.

In this illustrated embodiment, processor 902 includes one or more execution units 908 to implement an algorithm that is to perform at least one instruction. One embodiment may be described in the context of a single processor desktop or server system, but alternative embodiments may be included in a multiprocessor system. System 900 is an example of a 'hub' system architecture. The computer system 900 includes a processor 902 to process data signals. The processor 902, as one illustrative example, includes a complex instruction set computer (CISC) microprocessor, a reduced instruction set computing (RISC) microprocessor, a very long instruction word (VLIW) microprocessor, a processor implementing a combination of instruction sets, or any other processor device, such as a digital signal processor, for example. The processor 902 is coupled to a processor bus 910 that transmits data signals between the processor 902 and other components in the system 900. The elements of system 900 (e.g. graphics accelerator 912, memory controller hub 916, memory 920, I/O controller hub 924, wireless transceiver 926, Flash BIOS 928, Network controller 934, Audio controller 936, Serial expansion port 938, I/O controller 940, etc.) perform their conventional functions that are well known to those familiar with the art.

In one embodiment, the processor 902 includes a Level 1 (L1) internal cache memory 904. Depending on the architecture, the processor 902 may have a single internal cache or multiple levels of internal caches. Other embodiments include a combination of both internal and external caches depending on the particular implementation and needs. Register file 906 is to store different types of data in various registers including integer registers, floating point registers, vector registers, banked registers, shadow registers, checkpoint registers, status registers, and instruction pointer register.

Execution unit 908, including logic to perform integer and floating point operations, also resides in the processor 902. The processor 902, in one embodiment, includes a microcode (ucode) ROM to store microcode, which when executed, is to perform algorithms for certain macroinstructions or handle complex scenarios. Here, microcode is potentially updateable to handle logic bugs/fixes for processor 902. For one embodiment, execution unit 908 includes logic to handle a packed instruction set 909. By including the packed instruction set 909 in the instruction set of a general-purpose processor 902, along with associated circuitry to execute the instructions, the operations used by many multimedia applications may be performed using packed data in a general-purpose processor 902. Thus, many multimedia applications are accelerated and executed more efficiently by using the full width of a processor's data bus for performing operations on packed data. This potentially eliminates the need to transfer smaller units of data across the processor's data bus to perform one or more operations, one data element at a time.

Alternate embodiments of an execution unit 908 may also be used in micro controllers, embedded processors, graphics devices, DSPs, and other types of logic circuits. System 900 includes a memory 920. Memory 920 includes a dynamic random access memory (DRAM) device, a static random access memory (SRAM) device, flash memory device, or other memory device. Memory 920 stores instructions and/or data represented by data signals that are to be executed by the processor 902.

Note that any of the aforementioned features or aspects of the invention may be utilized on one or more interconnect illustrated in FIG. 9. For example, an on-die interconnect (ODI), which is not shown, for coupling internal units of processor 902 implements one or more aspects of the invention described above. Or the invention is associated with a processor bus 910 (e.g. Intel Quick Path Interconnect (QPI) or other known high performance computing interconnect), a high bandwidth memory path 918 to memory 920, a point-to-point link to graphics accelerator 912 (e.g. a Peripheral Component Interconnect express (PCIe) compliant fabric), a controller hub interconnect 922, an I/O or other interconnect (e.g. USB, PCI, PCIe) for coupling the other illustrated components. Some examples of such components include the audio controller 936, firmware hub (flash BIOS) 928, wireless transceiver 926, data storage 924, legacy I/O controller 910 containing user input and keyboard interfaces 942, a serial expansion port 938 such as Universal Serial Bus (USB), and a network controller 934. The data storage device 924 can comprise a hard disk drive, a floppy disk drive, a CD-ROM device, a flash memory device, or other mass storage device.

Figure 10:
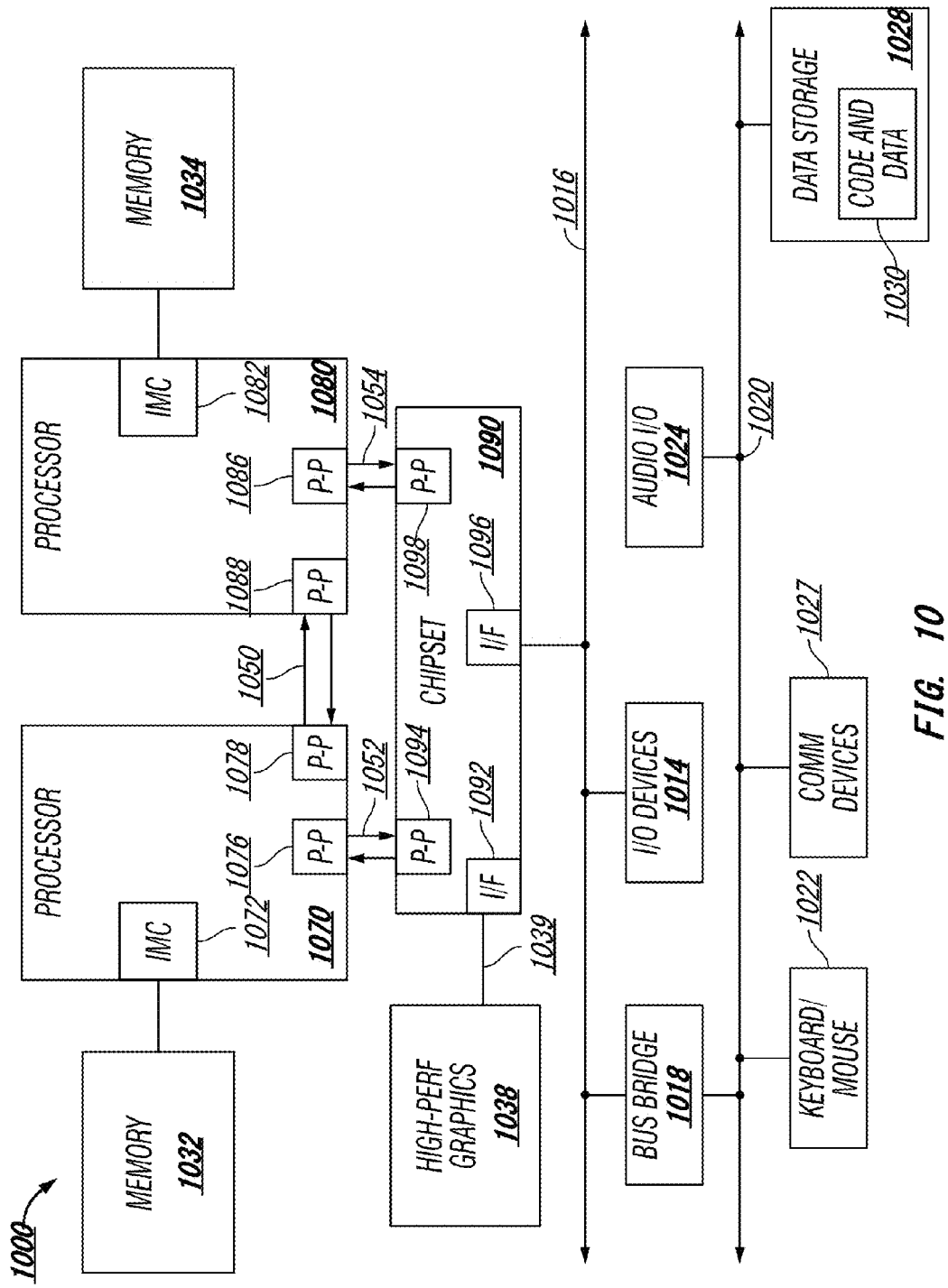
FIG. 10 illustrates an embodiment of a block for a computing system including multiple processor sockets.

Referring now to FIG. 10, shown is a block diagram of a second system 1000 in accordance with an embodiment of the present invention. As shown in FIG. 10, multiprocessor system 1000 is a point-to-point interconnect system, and includes a first processor 1070 and a second processor 1080 coupled via a point-to-point interconnect 1050. Each of processors 1070 and 1080 may be some version of a processor. In one embodiment, 1052 and 1054 are part of a serial, point-to-point coherent interconnect fabric, such as Intel's Quick Path Interconnect (QPI) architecture. As a result, the invention may be implemented within the QPI architecture.

While shown with only two processors 1070, 1080, it is to be understood that the scope of the present invention is not so limited. In other embodiments, one or more additional processors may be present in a given processor.

Processors 1070 and 1080 are shown including integrated memory controller units 1072 and 1082, respectively. Processor 1070 also includes as part of its bus controller units point-to-point (P-P) interfaces 1076 and 1078; similarly, second processor 1080 includes P-P interfaces 1086 and 1088. Processors 1070, 1080 may exchange information via a point-to-point (P-P) interface 1050 using P-P interface circuits 1078, 1088. As shown in FIG. 10, IMCs 1072 and 1082 couple the processors to respective memories, namely a memory 1032 and a memory 1034, which may be portions of main memory locally attached to the respective processors.

Processors 1070, 1080 each exchange information with a chipset 1090 via individual P-P interfaces 1052, 1054 using point to point interface circuits 1076, 1094, 1086, 1098. Chipset 1090 also exchanges information with a high-performance graphics circuit 1038 via an interface circuit 1092 along a high-performance graphics interconnect 1039.

A shared cache (not shown) may be included in either processor or outside of both processors; yet connected with the processors via P-P interconnect, such that either or both processors' local cache information may be stored in the shared cache if a processor is placed into a low power mode.

Chipset 1090 may be coupled to a first bus 1016 via an interface 1096. In one embodiment, first bus 1016 may be a Peripheral Component Interconnect (PCI) bus, or a bus such as a PCI Express bus or another third generation I/O interconnect bus, although the scope of the present invention is not so limited.

As shown in FIG. 10, various I/O devices 1014 are coupled to first bus 1016, along with a bus bridge 1018 which couples first bus 1016 to a second bus 1020. In one embodiment, second bus 1020 includes a low pin count (LPC) bus. Various devices are coupled to second bus 1020 including, for example, a keyboard and/or mouse 1022, communication devices 1027 and a storage unit 1028 such as a disk drive or other mass storage device which often includes instructions/code and data 1030, in one embodiment. Further, an audio I/O 1024 is shown coupled to second bus 1020. Note that other architectures are possible, where the included components and interconnect architectures vary. For example, instead of the point-to-point architecture of FIG. 10, a system may implement a multi-drop bus or other such architecture.

Figure 11:
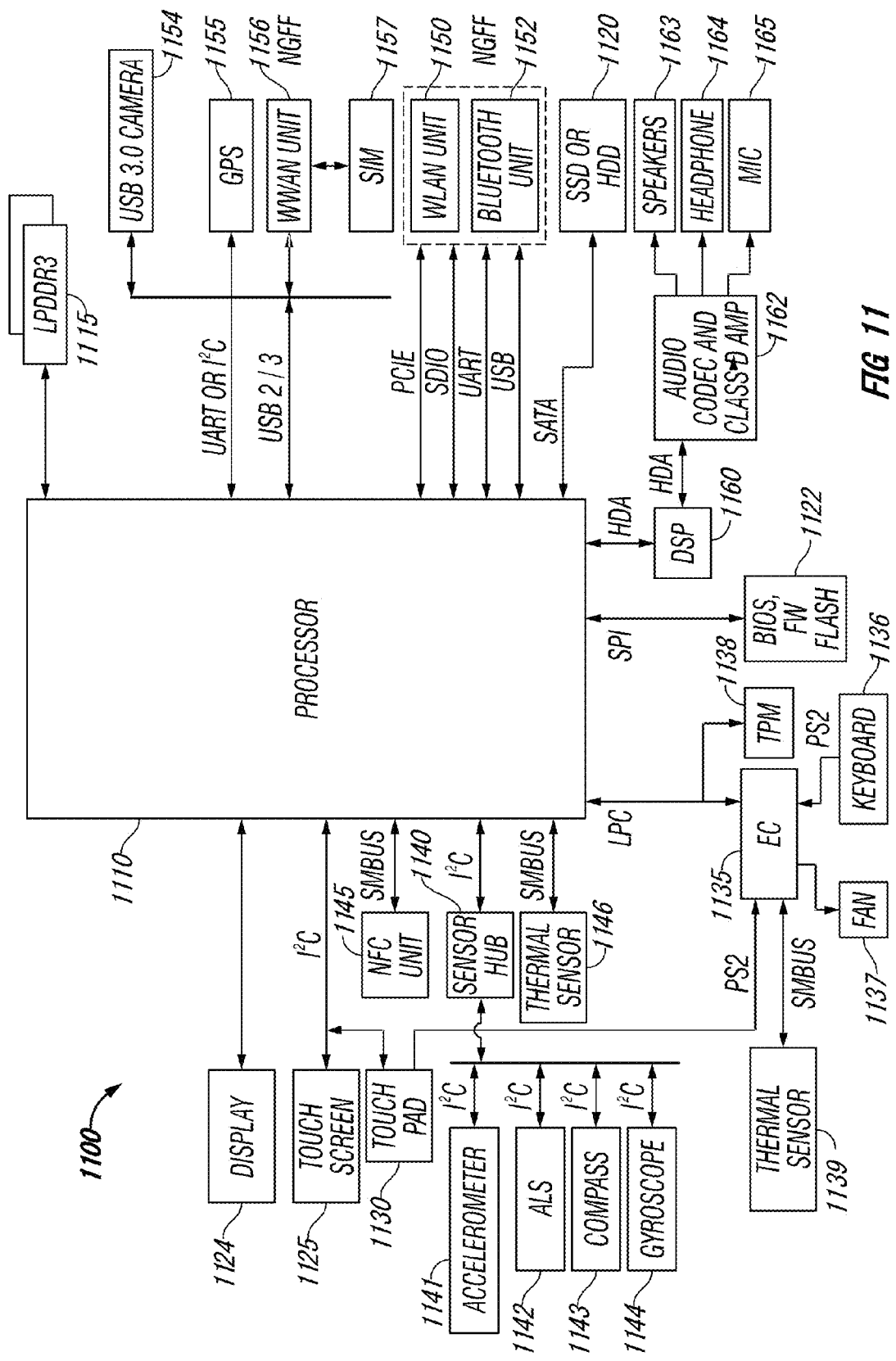
FIG. 11 illustrates another embodiment of a block diagram for a computing system.

Referring now to FIG. 11, a block diagram of components present in a computer system in accordance with an embodiment of the present invention is illustrated. As shown in FIG. 11, system 1100 includes any combination of components. These components may be implemented as ICs, portions thereof, discrete electronic devices, or other modules, logic, hardware, software, firmware, or a combination thereof adapted in a computer system, or as components otherwise incorporated within a chassis of the computer system. Note also that the block diagram of FIG. 11 is intended to show a high level view of many components of the computer system. However, it is to be understood that some of the components shown may be omitted, additional components may be present, and different arrangement of the components shown may occur in other implementations. As a result, the invention described above may be implemented in any portion of one or more of the interconnects illustrated or described below.

As seen in FIG. 11, a processor 1110, in one embodiment, includes a microprocessor, multi-core processor, multi-threaded processor, an ultra low voltage processor, an embedded processor, or other known processing element. In the illustrated implementation, processor 1110 acts as a main processing unit and central hub for communication with many of the various components of the system 1100. As one example, processor 1100 is implemented as a system on a chip (SoC). As a specific illustrative example, processor 1110 includes an Intel® Architecture Core™-based processor such as an i3, i5, i7 or another such processor available from Intel Corporation, Santa Clara, Calif. However, understand that other low power processors such as available from Advanced Micro Devices, Inc. (AMD) of Sunnyvale, Calif., a MIPS-based design from MIPS Technologies, Inc. of Sunnyvale, Calif., an ARM-based design licensed from ARM Holdings, Ltd. or customer thereof, or their licensees or adopters may instead be present in other embodiments such as an Apple A5/A6 processor, a Qualcomm Snapdragon processor, or TI OMAP processor. Note that many of the customer versions of such processors are modified and varied; however, they may support or recognize a specific instructions set that performs defined algorithms as set forth by the processor licensor. Here, the microarchitectural implementation may vary, but the architectural function of the processor is usually consistent. Certain details regarding the architecture and operation of processor 1110 in one implementation will be discussed further below to provide an illustrative example.

Processor 1110, in one embodiment, communicates with a system memory 1115. As an illustrative example, which in an embodiment can be implemented via multiple memory devices to provide for a given amount of system memory. As examples, the memory can be in accordance with a Joint Electron Devices Engineering Council (JEDEC) low power double data rate (LPDDR)-based design such as the current LPDDR2 standard according to JEDEC JESD 209-2E (published April 2009), or a next generation LPDDR standard to be referred to as LPDDR3 or LPDDR4 that will offer extensions to LPDDR2 to increase bandwidth. In various implementations the individual memory devices may be of different package types such as single die package (SDP), dual die package (DDP) or quad die package (9P). These devices, in some embodiments, are directly soldered onto a motherboard to provide a lower profile solution, while in other embodiments the devices are configured as one or more memory modules that in turn couple to the motherboard by a given connector. And of course, other memory implementations are possible such as other types of memory modules, e.g., dual inline memory modules (DIMMs) of different varieties including but not limited to microDIMMs, MiniDIMMs. In a particular illustrative embodiment, memory is sized between 2 GB and 16 GB, and may be configured as a DDR3LM package or an LPDDR2 or LPDDR3 memory that is soldered onto a motherboard via a ball grid array (BGA).

To provide for persistent storage of information such as data, applications, one or more operating systems and so forth, a mass storage 1120 may also couple to processor 1110. In various embodiments, to enable a thinner and lighter system design as well as to improve system responsiveness, this mass storage may be implemented via a SSD. However in other embodiments, the mass storage may primarily be implemented using a hard disk drive (HDD) with a smaller amount of SSD storage to act as a SSD cache to enable non-volatile storage of context state and other such information during power down events so that a fast power up can occur on re-initiation of system activities. Also shown in FIG. 11, a flash device 1122 may be coupled to processor 1110, e.g., via a serial peripheral interface (SPI). This flash device may provide for non-volatile storage of system software, including a basic input/output software (BIOS) as well as other firmware of the system.

In various embodiments, mass storage of the system is implemented by a SSD alone or as a disk, optical or other drive with an SSD cache. In some embodiments, the mass storage is implemented as a SSD or as a HDD along with a restore (RST) cache module. In various implementations, the HDD provides for storage of between 320 GB-4 terabytes (TB) and upward while the RST cache is implemented with a SSD having a capacity of 24 GB-256 GB. Note that such SSD cache may be configured as a single level cache (SLC) or multi-level cache (MLC) option to provide an appropriate level of responsiveness. In a SSD-only option, the module may be accommodated in various locations such as in a mSATA or NGFF slot. As an example, an SSD has a capacity ranging from 120 GB-1 TB.

Various input/output (IO) devices may be present within system 1100. Specifically shown in the embodiment of FIG. 11 is a display 1124 which may be a high definition LCD or LED panel configured within a lid portion of the chassis. This display panel may also provide for a touch screen 1125, e.g., adapted externally over the display panel such that via a user's interaction with this touch screen, user inputs can be provided to the system to enable desired operations, e.g., with regard to the display of information, accessing of information and so forth. In one embodiment, display 1124 may be coupled to processor 1110 via a display interconnect that can be implemented as a high performance graphics interconnect. Touch screen 1125 may be coupled to processor 1110 via another interconnect, which in an embodiment can be an I$^2$C interconnect. As further shown in FIG. 11, in addition to touch screen 1125, user input by way of touch can also occur via a touch pad 1130 which may be configured within the chassis and may also be coupled to the same I$^2$C interconnect as touch screen 1125.

The display panel may operate in multiple modes. In a first mode, the display panel can be arranged in a transparent state in which the display panel is transparent to visible light. In various embodiments, the majority of the display panel may be a display except for a bezel around the periphery. When the system is operated in a notebook mode and the display panel is operated in a transparent state, a user may view information that is presented on the display panel while also being able to view objects behind the display. In addition, information displayed on the display panel may be viewed by a user positioned behind the display. Or the operating state of the display panel can be an opaque state in which visible light does not transmit through the display panel.

In a tablet mode the system is folded shut such that the back display surface of the display panel comes to rest in a position such that it faces outwardly towards a user, when the bottom surface of the base panel is rested on a surface or held by the user. In the tablet mode of operation, the back display surface performs the role of a display and user interface, as this surface may have touch screen functionality and may perform other known functions of a conventional touch screen device, such as a tablet device. To this end, the display panel may include a transparency-adjusting layer that is disposed between a touch screen layer and a front display surface. In some embodiments the transparency-adjusting layer may be an electrochromic layer (EC), a LCD layer, or a combination of EC and LCD layers.

In various embodiments, the display can be of different sizes, e.g., an 11.6" or a 13.3" screen, and may have a 16:9 aspect ratio, and at least 300 nits brightness. Also the display may be of full high definition (HD) resolution (at least 1920×1080p), be compatible with an embedded display port (eDP), and be a low power panel with panel self refresh.

As to touch screen capabilities, the system may provide for a display multi-touch panel that is multi-touch capacitive and being at least 5 finger capable. And in some embodiments, the display may be 10 finger capable. In one embodiment, the touch screen is accommodated within a damage and scratch-resistant glass and coating (e.g., Gorilla Glass™ or Gorilla Glass 2™) for low friction to reduce "finger burn" and avoid "finger skipping". To provide for an enhanced touch experience and responsiveness, the touch panel, in some implementations, has multi-touch functionality, such as less than 2 frames (30 Hz) per static view during pinch zoom, and single-touch functionality of less than 1 cm per frame (30 Hz) with 200 ms (lag on finger to pointer). The display, in some implementations, supports edge-to-edge glass with a minimal screen bezel that is also flush with the panel surface, and limited IO interference when using multi-touch.

For perceptual computing and other purposes, various sensors may be present within the system and may be coupled to processor 1110 in different manners. Certain inertial and environmental sensors may couple to processor 1110 through a sensor hub 1140, e.g., via an I$^2$C interconnect. In the embodiment shown in FIG. 11, these sensors may include an accelerometer 1141, an ambient light sensor (ALS) 1142, a compass 1143 and a gyroscope 1144. Other environmental sensors may include one or more thermal sensors 1146 which in some embodiments couple to processor 1110 via a system management bus (SMBus) bus.

Using the various inertial and environmental sensors present in a platform, many different use cases may be realized. These use cases enable advanced computing operations including perceptual computing and also allow for enhancements with regard to power management/battery life, security, and system responsiveness.

For example with regard to power management/battery life issues, based at least on part on information from an ambient light sensor, the ambient light conditions in a location of the platform are determined and intensity of the display controlled accordingly. Thus, power consumed in operating the display is reduced in certain light conditions.

As to security operations, based on context information obtained from the sensors such as location information, it may be determined whether a user is allowed to access certain secure documents. For example, a user may be permitted to access such documents at a work place or a home location. However, the user is prevented from accessing such documents when the platform is present at a public location. This determination, in one embodiment, is based on location information, e.g., determined via a GPS sensor or camera recognition of landmarks. Other security operations may include providing for pairing of devices within a close range of each other, e.g., a portable platform as described herein and a user's desktop computer, mobile telephone or so forth. Certain sharing, in some implementations, are realized via near field communication when these devices are so paired. However, when the devices exceed a certain range, such sharing may be disabled. Furthermore, when pairing a platform as described herein and a smartphone, an alarm may be configured to be triggered when the devices move more than a predetermined distance from each other, when in a public location. In contrast, when these paired devices are in a safe location, e.g., a work place or home location, the devices may exceed this predetermined limit without triggering such alarm.

Responsiveness may also be enhanced using the sensor information. For example, even when a platform is in a low power state, the sensors may still be enabled to run at a relatively low frequency. Accordingly, any changes in a location of the platform, e.g., as determined by inertial sensors, GPS sensor, or so forth is determined. If no such changes have been registered, a faster connection to a previous wireless hub such as a Wi-Fi™ access point or similar wireless enabler occurs, as there is no need to scan for available wireless network resources in this case. Thus, a greater level of responsiveness when waking from a low power state is achieved.

It is to be understood that many other use cases may be enabled using sensor information obtained via the integrated sensors within a platform as described herein, and the above examples are only for purposes of illustration. Using a system as described herein, a perceptual computing system may allow for the addition of alternative input modalities, including gesture recognition, and enable the system to sense user operations and intent.

In some embodiments one or more infrared or other heat sensing elements, or any other element for sensing the presence or movement of a user may be present. Such sensing elements may include multiple different elements working together, working in sequence, or both. For example, sensing elements include elements that provide initial sensing, such as light or sound projection, followed by sensing for gesture detection by, for example, an ultrasonic time of flight camera or a patterned light camera.

Also in some embodiments, the system includes a light generator to produce an illuminated line. In some embodiments, this line provides a visual cue regarding a virtual boundary, namely an imaginary or virtual location in space, where action of the user to pass or break through the virtual boundary or plane is interpreted as an intent to engage with the computing system. In some embodiments, the illuminated line may change colors as the computing system transitions into different states with regard to the user. The illuminated line may be used to provide a visual cue for the user of a virtual boundary in space, and may be used by the system to determine transitions in state of the computer with regard to the user, including determining when the user wishes to engage with the computer.

In some embodiments, the computer senses user position and operates to interpret the movement of a hand of the user through the virtual boundary as a gesture indicating an intention of the user to engage with the computer. In some embodiments, upon the user passing through the virtual line or plane the light generated by the light generator may change, thereby providing visual feedback to the user that the user has entered an area for providing gestures to provide input to the computer.

Display screens may provide visual indications of transitions of state of the computing system with regard to a user. In some embodiments, a first screen is provided in a first state in which the presence of a user is sensed by the system, such as through use of one or more of the sensing elements.

In some implementations, the system acts to sense user identity, such as by facial recognition. Here, transition to a second screen may be provided in a second state, in which the computing system has recognized the user identity, where this second the screen provides visual feedback to the user that the user has transitioned into a new state. Transition to a third screen may occur in a third state in which the user has confirmed recognition of the user.

In some embodiments, the computing system may use a transition mechanism to determine a location of a virtual boundary for a user, where the location of the virtual boundary may vary with user and context. The computing system may generate a light, such as an illuminated line, to indicate the virtual boundary for engaging with the system. In some embodiments, the computing system may be in a waiting state, and the light may be produced in a first color. The computing system may detect whether the user has reached past the virtual boundary, such as by sensing the presence and movement of the user using sensing elements.

In some embodiments, if the user has been detected as having crossed the virtual boundary (such as the hands of the user being closer to the computing system than the virtual boundary line), the computing system may transition to a state for receiving gesture inputs from the user, where a mechanism to indicate the transition may include the light indicating the virtual boundary changing to a second color.

In some embodiments, the computing system may then determine whether gesture movement is detected. If gesture movement is detected, the computing system may proceed with a gesture recognition process, which may include the use of data from a gesture data library, which may reside in memory in the computing device or may be otherwise accessed by the computing device.

If a gesture of the user is recognized, the computing system may perform a function in response to the input, and return to receive additional gestures if the user is within the virtual boundary. In some embodiments, if the gesture is not recognized, the computing system may transition into an error state, where a mechanism to indicate the error state may include the light indicating the virtual boundary changing to a third color, with the system returning to receive additional gestures if the user is within the virtual boundary for engaging with the computing system.

As mentioned above, in other embodiments the system can be configured as a convertible tablet system that can be used in at least two different modes, a tablet mode and a notebook mode. The convertible system may have two panels, namely a display panel and a base panel such that in the tablet mode the two panels are disposed in a stack on top of one another. In the tablet mode, the display panel faces outwardly and may provide touch screen functionality as found in conventional tablets. In the notebook mode, the two panels may be arranged in an open clamshell configuration.

In various embodiments, the accelerometer may be a 3-axis accelerometer having data rates of at least 50 Hz. A gyroscope may also be included, which can be a 3-axis gyroscope. In addition, an e-compass/magnetometer may be present. Also, one or more proximity sensors may be provided (e.g., for lid open to sense when a person is in proximity (or not) to the system and adjust power/performance to extend battery life). For some OS's Sensor Fusion capability including the accelerometer, gyroscope, and compass may provide enhanced features. In addition, via a sensor hub having a real-time clock (RTC), a wake from sensors mechanism may be realized to receive sensor input when a remainder of the system is in a low power state.

In some embodiments, an internal lid/display open switch or sensor to indicate when the lid is closed/open, and can be used to place the system into Connected Standby or automatically wake from Connected Standby state. Other system sensors can include ACPI sensors for internal processor, memory, and skin temperature monitoring to enable changes to processor and system operating states based on sensed parameters.

In an embodiment, the OS may be a Microsoft® Windows® 8 OS that implements Connected Standby (also referred to herein as Win8 CS). Windows 8 Connected Standby or another OS having a similar state can provide, via a platform as described herein, very low ultra idle power to enable applications to remain connected, e.g., to a cloud-based location, at very low power consumption. The platform can supports 3 power states, namely screen on (normal); Connected Standby (as a default "off" state); and shutdown (zero watts of power consumption). Thus in the Connected Standby state, the platform is logically on (at minimal power levels) even though the screen is off. In such a platform, power management can be made to be transparent to applications and maintain constant connectivity, in part due to offload technology to enable the lowest powered component to perform an operation.

Also seen in FIG. 11, various peripheral devices may couple to processor 1110 via a low pin count (LPC) interconnect. In the embodiment shown, various components can be coupled through an embedded controller 1135. Such components can include a keyboard 1136 (e.g., coupled via a PS2 interface), a fan 1137, and a thermal sensor 1139. In some embodiments, touch pad 1130 may also couple to EC 1135 via a PS2 interface. In addition, a security processor such as a trusted platform module (TPM) 1138 in accordance with the Trusted Computing Group (TCG) TPM Specification Version 1.2, dated Oct. 2, 2003, may also couple to processor 1110 via this LPC interconnect. However, understand the scope of the present invention is not limited in this regard and secure processing and storage of secure information may be in another protected location such as a static random access memory (SRAM) in a security coprocessor, or as encrypted data blobs that are only decrypted when protected by a secure enclave (SE) processor mode.

In a particular implementation, peripheral ports may include a high definition media interface (HDMI) connector (which can be of different form factors such as full size, mini or micro); one or more USB ports, such as full-size external ports in accordance with the Universal Serial Bus Revision 3.0 Specification (November 2008), with at least one powered for charging of USB devices (such as smartphones) when the system is in Connected Standby state and is plugged into AC wall power. In addition, one or more Thunderbolt™ ports can be provided. Other ports may include an externally accessible card reader such as a full size SD-XC card reader and/or a SIM card reader for WWAN (e.g., an 8 pin card reader). For audio, a 3.5 mm jack with stereo sound and microphone capability (e.g., combination functionality) can be present, with support for jack detection (e.g., headphone only support using microphone in the lid or headphone with microphone in cable). In some embodiments, this jack can be re-taskable between stereo headphone and stereo microphone input. Also, a power jack can be provided for coupling to an AC brick.

System 1100 can communicate with external devices in a variety of manners, including wirelessly. In the embodiment shown in FIG. 11, various wireless modules, each of which can correspond to a radio configured for a particular wireless communication protocol, are present. One manner for wireless communication in a short range such as a near field may be via a near field communication (NFC) unit 1145 which may communicate, in one embodiment with processor 1110 via an SMBus. Note that via this NFC unit 1145, devices in close proximity to each other can communicate. For example, a user can enable system 1100 to communicate with another (e.g.,) portable device such as a smartphone of the user via adapting the two devices together in close relation and enabling transfer of information such as identification information payment information, data such as image data or so forth. Wireless power transfer may also be performed using a NFC system.

Using the NFC unit described herein, users can bump devices side-to-side and place devices side-by-side for near field coupling functions (such as near field communication and wireless power transfer (WPT)) by leveraging the coupling between coils of one or more of such devices. More specifically, embodiments provide devices with strategically shaped, and placed, ferrite materials, to provide for better coupling of the coils. Each coil has an inductance associated with it, which can be chosen in conjunction with the resistive, capacitive, and other features of the system to enable a common resonant frequency for the system.

As further seen in FIG. 11, additional wireless units can include other short range wireless engines including a WLAN unit 1150 and a Bluetooth unit 1152. Using WLAN unit 1150, Wi-Fi™ communications in accordance with a given Institute of Electrical and Electronics Engineers (IEEE) 802.11 standard can be realized, while via Bluetooth unit 1152, short range communications via a Bluetooth protocol can occur. These units may communicate with processor 1110 via, e.g., a USB link or a universal asynchronous receiver transmitter (UART) link. Or these units may couple to processor 1110 via an interconnect according to a Peripheral Component Interconnect Express™ (PCIe™) protocol, e.g., in accordance with the PCI Express™ Specification Base Specification version 3.0 (published Jan. 17, 2007), or another such protocol such as a serial data input/output (SDIO) standard. Of course, the actual physical connection between these peripheral devices, which may be configured on one or more add-in cards, can be by way of the NGFF connectors adapted to a motherboard.

In addition, wireless wide area communications, e.g., according to a cellular or other wireless wide area protocol, can occur via a WWAN unit 1156 which in turn may couple to a subscriber identity module (SIM) 1157. In addition, to enable receipt and use of location information, a GPS module 1155 may also be present. Note that in the embodiment shown in FIG. 11, WWAN unit 1156 and an integrated capture device such as a camera module 1154 may communicate via a given USB protocol such as a USB 2.0 or 3.0 link, or a UART or I²C protocol. Again the actual physical connection of these units can be via adaptation of a NGFF add-in card to an NGFF connector configured on the motherboard.

In a particular embodiment, wireless functionality can be provided modularly, e.g., with a WiFi™ 802.11ac solution (e.g., add-in card that is backward compatible with IEEE 802.11abgn) with support for Windows 8 CS. This card can be configured in an internal slot (e.g., via an NGFF adapter). An additional module may provide for Bluetooth capability (e.g., Bluetooth 4.0 with backwards compatibility) as well as Intel® Wireless Display functionality. In addition NFC support may be provided via a separate device or multifunction device, and can be positioned as an example, in a front right portion of the chassis for easy access. A still additional module may be a WWAN device that can provide support for 3G/4G/LTE and GPS. This module can be implemented in an internal (e.g., NGFF) slot. Integrated antenna support can be provided for WiFi™, Bluetooth, WWAN, NFC and GPS, enabling seamless transition from WiFi™ to WWAN radios, wireless gigabit (WiGig) in accordance with the Wireless Gigabit Specification (July 2010), and vice versa.

As described above, an integrated camera can be incorporated in the lid. As one example, this camera can be a high resolution camera, e.g., having a resolution of at least 2.0 megapixels (MP) and extending to 6.0 MP and beyond.

To provide for audio inputs and outputs, an audio processor can be implemented via a digital signal processor (DSP) 1160, which may couple to processor 1110 via a high definition audio (HDA) link. Similarly, DSP 1160 may communicate with an integrated coder/decoder (CODEC) and amplifier 1162 that in turn may couple to output speakers 1163 which may be implemented within the chassis. Similarly, amplifier and CODEC 1162 can be coupled to receive audio inputs from a microphone 1165 which in an embodiment can be implemented via dual array microphones (such as a digital microphone array) to provide for high quality audio inputs to enable voice-activated control of various operations within the system. Note also that audio outputs can be provided from amplifier/CODEC 1162 to a headphone jack 1164. Although shown with these particular components in the embodiment of FIG. 11, understand the scope of the present invention is not limited in this regard.

In a particular embodiment, the digital audio codec and amplifier are capable of driving the stereo headphone jack, stereo microphone jack, an internal microphone array and stereo speakers. In different implementations, the codec can be integrated into an audio DSP or coupled via an HD audio path to a peripheral controller hub (PCH). In some implementations, in addition to integrated stereo speakers, one or more bass speakers can be provided, and the speaker solution can support DTS audio.

In some embodiments, processor 1110 may be powered by an external voltage regulator (VR) and multiple internal voltage regulators that are integrated inside the processor die, referred to as fully integrated voltage regulators (FIVRs). The use of multiple FIVRs in the processor enables the grouping of components into separate power planes, such that power is regulated and supplied by the FIVR to only those components in the group. During power management, a given power plane of one FIVR may be powered down or off when the processor is placed into a certain low power state, while another power plane of another FIVR remains active, or fully powered.

In one embodiment, a sustain power plane can be used during some deep sleep states to power on the I/O pins for several I/O signals, such as the interface between the processor and a PCH, the interface with the external VR and the interface with EC 1135. This sustain power plane also powers an on-die voltage regulator that supports the on-board SRAM or other cache memory in which the processor context is stored during the sleep state. The sustain power plane is also used to power on the processor's wakeup logic that monitors and processes the various wakeup source signals.

During power management, while other power planes are powered down or off when the processor enters certain deep sleep states, the sustain power plane remains powered on to support the above-referenced components. However, this can lead to unnecessary power consumption or dissipation when those components are not needed. To this end, embodiments may provide a connected standby sleep state to maintain processor context using a dedicated power plane. In one embodiment, the connected standby sleep state facilitates processor wakeup using resources of a PCH which itself may be present in a package with the processor. In one embodiment, the connected standby sleep state facilitates sustaining processor architectural functions in the PCH until processor wakeup, this enabling turning off all of the unnecessary processor components that were previously left powered on during deep sleep states, including turning off all of the clocks. In one embodiment, the PCH contains a time stamp counter (TSC) and connected standby logic for controlling the system during the connected standby state. The integrated voltage regulator for the sustain power plane may reside on the PCH as well.

In an embodiment, during the connected standby state, an integrated voltage regulator may function as a dedicated power plane that remains powered on to support the dedicated cache memory in which the processor context is stored such as critical state variables when the processor enters the deep sleep states and connected standby state. This critical state may include state variables associated with the architectural, micro-architectural, debug state, and/or similar state variables associated with the processor.

The wakeup source signals from EC 1135 may be sent to the PCH instead of the processor during the connected standby state so that the PCH can manage the wakeup processing instead of the processor. In addition, the TSC is maintained in the PCH to facilitate sustaining processor architectural functions. Although shown with these particular components in the embodiment of FIG. 11, understand the scope of the present invention is not limited in this regard.

Power control in the processor can lead to enhanced power savings. For example, power can be dynamically allocate between cores, individual cores can change frequency/voltage, and multiple deep low power states can be provided to enable very low power consumption. In addition, dynamic control of the cores or independent core portions can provide for reduced power consumption by powering off components when they are not being used.

Some implementations may provide a specific power management IC (PMIC) to control platform power. Using this solution, a system may see very low (e.g., less than 5%) battery degradation over an extended duration (e.g., 16 hours) when in a given standby state, such as when in a Win8 Connected Standby state. In a Win8 idle state a battery life exceeding, e.g., 9 hours may be realized (e.g., at 150 nits). As to video playback, a long battery life can be realized, e.g., full HD video playback can occur for a minimum of 6 hours. A platform in one implementation may have an energy capacity of, e.g., 35 watt hours (Whr) for a Win8 CS using an SSD and (e.g.,) 40-44 Whr for Win8 CS using an HDD with a RST cache configuration.

A particular implementation may provide support for 15 W nominal CPU thermal design power (TDP), with a configurable CPU TDP of up to approximately 25 W TDP design point. The platform may include minimal vents owing to the thermal features described above. In addition, the platform is pillow-friendly (in that no hot air is blowing at the user). Different maximum temperature points can be realized depending on the chassis material. In one implementation of a plastic chassis (at least having to lid or base portion of plastic), the maximum operating temperature can be 52 degrees Celsius (C). And for an implementation of a metal chassis, the maximum operating temperature can be 46° C.

In different implementations, a security module such as a TPM can be integrated into a processor or can be a discrete device such as a TPM 2.0 device. With an integrated security module, also referred to as Platform Trust Technology (PTT), BIOS/firmware can be enabled to expose certain hardware features for certain security features, including secure instructions, secure boot, Intel® Anti-Theft Technology, Intel® Identity Protection Technology, Intel® Trusted Execution Technology (TXT), and Intel® Manageability Engine Technology along with secure user interfaces such as a secure keyboard and display.

Figure 12:
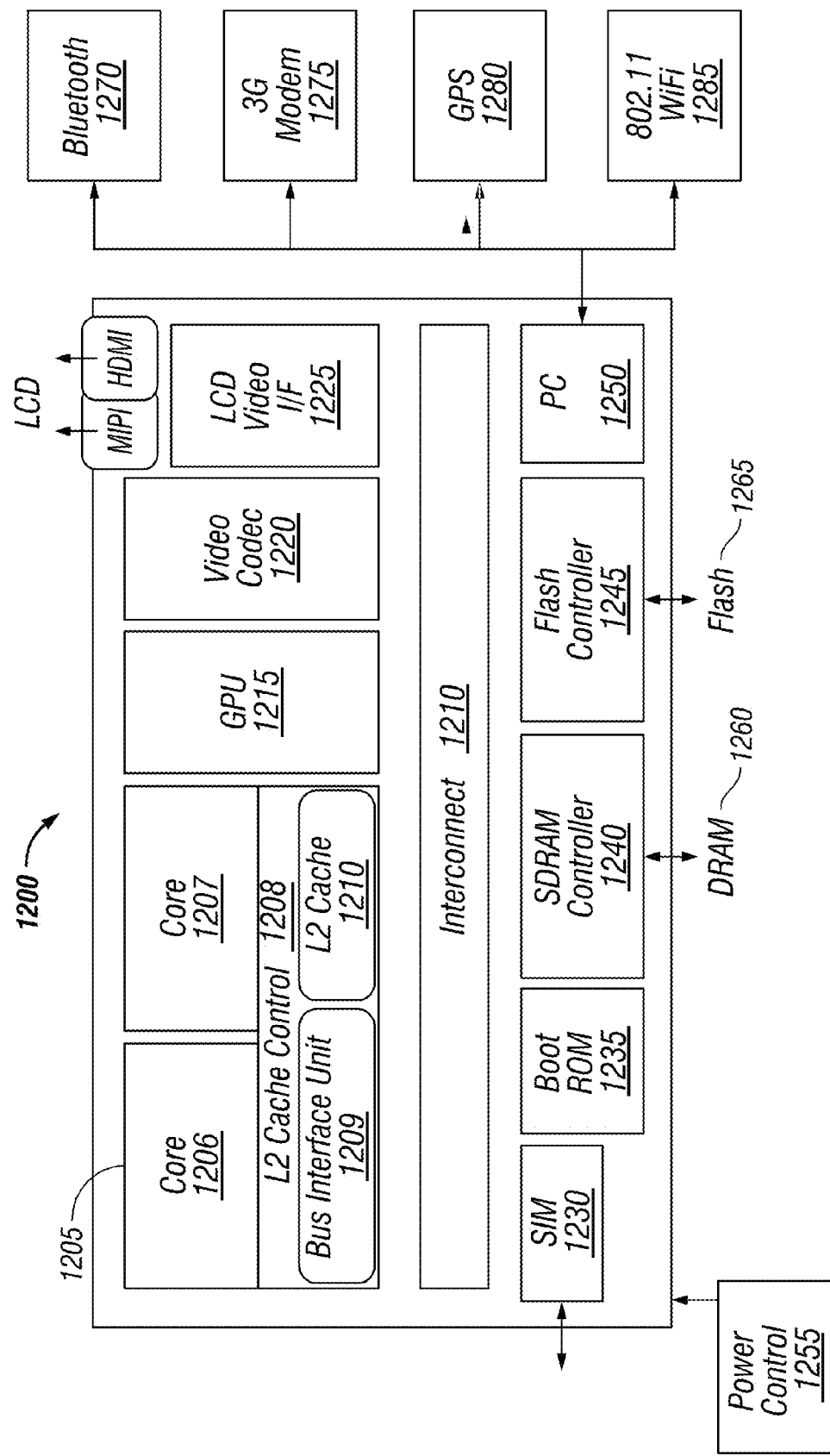
FIG. 12 illustrates another embodiment of a block diagram for a computing system.

Turning next to FIG. 12, an embodiment of a system on-chip (SOC) design in accordance with the inventions is depicted. As a specific illustrative example, SOC 1200 is included in user equipment (UE). In one embodiment, UE refers to any device to be used by an end-user to communicate, such as a hand-held phone, smartphone, tablet, ultra-thin notebook, notebook with broadband adapter, or any other similar communication device. Often a UE connects to a base station or node, which potentially corresponds in nature to a mobile station (MS) in a GSM network.

Here, SOC 1200 includes 2 cores—1206 and 1207. Similar to the discussion above, cores 1206 and 1207 may conform to an Instruction Set Architecture, such as an Intel®

Architecture Core™-based processor, an Advanced Micro Devices, Inc. (AMD) processor, a MIPS-based processor, an ARM-based processor design, or a customer thereof, as well as their licensees or adopters. Cores 1206 and 1207 are coupled to cache control 1208 that is associated with bus interface unit 1209 and L2 cache 1210 to communicate with other parts of system 1200. Interconnect 1210 includes an on-chip interconnect, such as an IOSF, AMBA, or other interconnect discussed above, which potentially implements one or more aspects of the described invention.

Interface 1210 provides communication channels to the other components, such as a Subscriber Identity Module (SIM) 1230 to interface with a SIM card, a boot rom 1235 to hold boot code for execution by cores 1206 and 1207 to initialize and boot SOC 1200, a SDRAM controller 1240 to interface with external memory (e.g. DRAM 1260), a flash controller 1245 to interface with non-volatile memory (e.g. Flash 1265), a peripheral control 850 (e.g. Serial Peripheral Interface) to interface with peripherals, video codecs 1220 and Video interface 1225 to display and receive input (e.g. touch enabled input), GPU 1215 to perform graphics related computations, etc. Any of these interfaces may incorporate aspects of the invention described herein.

In addition, the system illustrates peripherals for communication, such as a Bluetooth module 1270, 3G modem 1275, GPS 1285, and WiFi 1285. Note as stated above, a UE includes a radio for communication. As a result, these peripheral communication modules are not all required. However, in a UE some form a radio for external communication is to be included.

The following examples pertain to embodiments in accordance with this Specification. One or more embodiments may provide an apparatus, a system, a machine readable storage, a machine readable medium, hardware- and/or software-based logic, and a method to generate a clock signal; to phase shift the clock signal by a test phase; to measure an error rate of the test phase; and to select an operational phase of the clock signal based at least in part on the error rate of the test phase.

In at least one example, the phase shifter is a quantized phase shifter.

In at least one example, an interconnect apparatus further comprises an error comparator, wherein the test phase is a first test phase, and wherein:

In at least one example, the phase shifter is further to shift the clock signal by a second test phase;

In at least one example, the error rate detector is further to measure an error of the second test phase; and In at least one example, the error comparator is to compare the error rate of the first test phase to the error rate of the second test phase and to select an optimal test phase; and In at least one example, the operational phase selector selects the operational phase of the clock signal based at least in part on the error rate of the first test phase by selecting the operational phase of the clock signal based at least in part on the optimal test phase.

In at least one example, the interconnect apparatus further comprises a reference voltage shifter, and an operational voltage selector, wherein: the reference voltage shifter is to shift a reference voltage by a test voltage; wherein the error rate detector is further to measure an error rate of the test voltage; and wherein the operational voltage selector is to select an operational reference voltage of the clock signal based at least in part on the error rate of the test voltage.

In at least one example, the test voltage is a first test voltage; the reference voltage shifter is further to shift the reference voltage by a second test voltage; the error comparator is further to compare the error rate of the first test voltage to an error rate of the second test voltage and to select an optimal test voltage; and wherein the operational voltage selector selects the operational voltage of the clock signal based at least in part on the first test voltage by selecting the operational voltage of the clock signal based at least in part on the optimal test voltage.

In at least one example, the interconnect apparatus further comprises an eye constructor, and a two-dimensional factor shifter; wherein: the eye constructor is to construct an eye based at least in part on the optimal phase and the optimal voltage; the two dimensional factor shifter is to select first and second phase and voltage pairs within the eye; the error rate detector is further to measure an error rate for each of the first and second phase and voltage pairs; and the error rate detector is further to compare the error rate of the first phase and voltage pair to the error rate of the second phase and voltage pair, and select an optimal phase and voltage pair.

In at least one example, the error rate detector measures the error rate by receiving a test pattern onto a first lane, and a crosstalk pattern on at least one adjacent lane.

In at least one example, the crosstalk pattern is a logical inverse of the test pattern.

In at least one example, the first virtual channel is a real-time virtual channel (VC_RT) and the second virtual channel is an auxiliary virtual channel (VC_AUX).

While the present invention has been described with respect to a limited number of embodiments, those skilled in the art will appreciate numerous modifications and variations therefrom. It is intended that the appended claims cover all such modifications and variations as fall within the true spirit and scope of this present invention.

A design may go through various stages, from creation to simulation to fabrication. Data representing a design may represent the design in a number of manners. First, as is useful in simulations, the hardware may be represented using a hardware description language or another functional description language. Additionally, a circuit level model with logic and/or transistor gates may be produced at some stages of the design process. Furthermore, most designs, at some stage, reach a level of data representing the physical placement of various devices in the hardware model. In the case where conventional semiconductor fabrication techniques are used, the data representing the hardware model may be the data specifying the presence or absence of various features on different mask layers for masks used to produce the integrated circuit. In any representation of the design, the data may be stored in any form of a machine readable medium. A memory or a magnetic or optical storage such as a disc may be the machine readable medium to store information transmitted via optical or electrical wave modulated or otherwise generated to transmit such information. When an electrical carrier wave indicating or carrying the code or design is transmitted, to the extent that copying, buffering, or re-transmission of the electrical signal is performed, a new copy is made. Thus, a communication provider or a network provider may store on a tangible, machine-readable medium, at least temporarily, an article, such as information encoded into a carrier wave, embodying techniques of embodiments of the present invention.

A module as used herein refers to any combination of hardware, software, and/or firmware. As an example, a module includes hardware, such as a micro-controller, associated with a non-transitory medium to store code adapted to be executed by the micro-controller. Therefore, reference to a module, in one embodiment, refers to the hardware, which is specifically configured to recognize and/or execute the code to be held on a non-transitory medium. Furthermore, in another embodiment, use of a module refers to the non-transitory medium including the code, which is specifically adapted to be executed by the microcontroller to perform predetermined operations. And as can be inferred, in yet another embodiment, the term module (in this example) may refer to the combination of the microcontroller and the non-transitory medium. Often module boundaries that are illustrated as separate commonly vary and potentially overlap. For example, a first and a second module may share hardware, software, firmware, or a combination thereof, while potentially retaining some independent hardware, software, or firmware. In one embodiment, use of the term logic includes hardware, such as transistors, registers, or other hardware, such as programmable logic devices.

Use of the phrase 'to' or 'configured to,' in one embodiment, refers to arranging, putting together, manufacturing, offering to sell, importing and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation. But a logic gate 'configured to' provide an enable signal to a clock does not include every potential logic gate that may provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'capable of/to,' and or 'operable to,' in one embodiment, refers to some apparatus, logic, hardware, and/or element designed in such a way to enable use of the apparatus, logic, hardware, and/or element in a specified manner. Note as above that use of to, capable to, or operable to, in one embodiment, refers to the latent state of an apparatus, logic, hardware, and/or element, where the apparatus, logic, hardware, and/or element is not operating but is designed in such a manner to enable use of an apparatus in a specified manner.

A value, as used herein, includes any known representation of a number, a state, a logical state, or a binary logical state. Often, the use of logic levels, logic values, or logical values is also referred to as 1's and 0's, which simply represents binary logic states. For example, a 1 refers to a high logic level and 0 refers to a low logic level. In one embodiment, a storage cell, such as a transistor or flash cell, may be capable of holding a single logical value or multiple logical values. However, other representations of values in computer systems have been used. For example the decimal number ten may also be represented as a binary value of 1010 and a hexadecimal letter A. Therefore, a value includes any representation of information capable of being held in a computer system.

Moreover, states may be represented by values or portions of values. As an example, a first value, such as a logical one, may represent a default or initial state, while a second value, such as a logical zero, may represent a non-default state. In addition, the terms reset and set, in one embodiment, refer to a default and an updated value or state, respectively. For example, a default value potentially includes a high logical value, i.e. reset, while an updated value potentially includes a low logical value, i.e. set. Note that any combination of values may be utilized to represent any number of states.

The embodiments of methods, hardware, software, firmware or code set forth above may be implemented via instructions or code stored on a machine-accessible, machine readable, computer accessible, or computer readable medium which are executable by a processing element. A non-transitory machine-accessible/readable medium includes any mechanism that provides (i.e., stores and/or transmits) information in a form readable by a machine, such as a computer or electronic system. For example, a non-transitory machine-accessible medium includes random-access memory (RAM), such as static RAM (SRAM) or dynamic RAM (DRAM); ROM; magnetic or optical storage medium; flash memory devices; electrical storage devices; optical storage devices; acoustical storage devices; other form of storage devices for holding information received from transitory (propagated) signals (e.g., carrier waves, infrared signals, digital signals); etc, which are to be distinguished from the non-transitory mediums that may receive information there from.

Instructions used to program logic to perform embodiments of the invention may be stored within a memory in the system, such as DRAM, cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer)

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the foregoing specification, a detailed description has been given with reference to specific exemplary embodiments. It will, however, be evident that various modifications and changes may be made thereto without departing from the broader spirit and scope of the invention as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but may refer to different and distinct embodiments, as well as potentially the same embodiment.

What is claimed is:

1. An interconnect apparatus comprising:
a clock generator to generate a clock signal at a low speed for the interconnect;
a phase shifter to phase shift the clock signal by a first test phase;
an error rate detector to measure an error rate of the test phase;
the phase shifter is further to shift the clock signal by a second test phase;
the error rate detector is further to measure an error of the second test phase;
an error comparator to compare the error rate of the first test phase to the error rate of the second test phase and to select an optimal test phase;
an operational phase selector to select the operational phase of the clock signal based at least in part on the optimal test phase;
a reference voltage shifter to shift a reference voltage by a test voltage at an operational speed of the interconnect;
the error rate detector is further to measure an error rate of the test voltage; and
an operational voltage selector to select an operational reference voltage of the clock signal based at least in part on the error rate of the test voltage.

2. The interconnect apparatus of claim 1, wherein the phase shifter is a quantized phase shifter.

3. The interconnect apparatus of claim 1, wherein:
the test voltage is a first test voltage;
the reference voltage shifter is further to shift the reference voltage by a second test voltage;
the error comparator is further to compare the error rate of the first test voltage to an error rate of the second test voltage and to select an optimal test voltage; and
wherein the operational voltage selector selects an operational voltage of the clock signal based at least in part on the first test voltage by selecting the operational reference voltage of the clock signal based at least in part on the optimal test voltage.

4. The interconnect apparatus of claim 3, further comprising an eye constructor, and a two-dimensional factor shifter; wherein:
the eye constructor is to construct an eye based at least in part on the optimal phase and the optimal voltage;
the two dimensional factor shifter is to select first and second phase and voltage pairs within the eye;
the error rate detector is further to measure an error rate for each of the first and second phase and voltage pairs; and
the error rate detector is further to compare the error rate of the first phase and voltage pair to the error rate of the second phase and voltage pair, and select an optimal phase and voltage pair.

5. The interconnect apparatus of claim 1, wherein the error rate detector measures the error rate by receiving a test pattern onto a first lane, and a crosstalk pattern on at least one adjacent lane.

6. The interconnect apparatus of claim 5, wherein the crosstalk pattern is a logical inverse of the test pattern.

7. An interconnected system, comprising:
a first agent;
a second agent; and
an interconnect to communicatively couple the first agent to the second agent, comprising:
a clock generator to generate a clock signal at a low speed for the interconnect;
a phase shifter to phase shift the clock signal by a test phase;
an error rate detector to measure an error rate of the test phase;
the phase shifter is further to shift the clock signal by a second test phase;
the error rate detector is further to measure an error of the second test phase;
an error comparator to compare the error rate of the first test phase to the error rate of the second test phase and to select an optimal test phase;
an operational phase selector to select an operational phase of the clock signal based at least in part on the optimal test phase;
a reference voltage shifter to shift a reference voltage by a test voltage;
the error rate detector is further to measure an error rate of the test voltage at an operational speed for the interconnect; and
an operational voltage selector to select an operational reference voltage of the clock signal based at least in part on the error rate of the test voltage.

8. The interconnected system of claim 7, wherein the phase shifter is a quantized phase shifter.

9. The interconnected system of claim 7, wherein:
the test voltage is a first test voltage;
the reference voltage shifter is further to shift the reference voltage by a second test voltage;
the error comparator is further to compare the error rate of the first test voltage to an error rate of the second test voltage and to select an optimal test voltage; and
wherein the operational voltage selector selects the operational voltage of the clock signal based at least in part on the first test voltage by selecting the operational voltage of the clock signal based at least in part on the optimal test voltage.

10. The interconnected system of claim 9, wherein the interconnect further comprises an eye constructor and a two-dimensional factor shifter; wherein:
the eye constructor is to construct an eye based at least in part on the optimal test phase and the optimal reference voltage;
the two-dimensional factor shifter is to select first and second phase and voltage pairs within the eye;
the error rate detector is further to measure an error rate for each of the first and second phase and voltage pairs; and
the error rate detector is further to compare the error rate of the first phase and voltage pair to the error rate of the second phase and voltage pair, and select an optimal phase and voltage pair.

11. The interconnected system of claim 7, wherein the first agent is to drive a first pattern onto a first lane and a crosstalk pattern onto a second lane, and wherein the error rate detector measures the error rate by sampling the first pattern.

12. The interconnected system of claim 11, wherein the crosstalk pattern is a logical inverse of the test pattern.

13. One or more tangible, non-transitory computer-readable mediums having stored thereon executable instructions to:
generate a clock signal;
phase shift the clock signal by a quantized test phase at a low speed for an interconnect;
detect an error rate of the test phase;
shift the clock signal by a second test phase;
measure an error of the second test phase;

compare the error rate of the first test phase to the error rate of the second test phase and select an optimal test phase;
select an operational phase of the clock signal based at least in part on the optimal test phase;
shift a reference voltage by a test voltage;
measure an error rate of the test voltage at an operational speed for the interconnect; and
select an operational reference voltage of the clock signal based at least in part on the error rate of the test voltage.

14. The one or more computer-readable mediums of claim 13, wherein the test voltage is a first test voltage, and the instructions are further to:
shift the reference voltage by a second test voltage;
compare the error rate of the first test voltage to an error rate of the second test voltage and select an optimal test voltage; and
select the operational reference voltage of the clock signal based at least in part on the first test voltage by selecting the operational voltage of the clock signal based at least in part on the optimal test voltage.

15. The one or more computer-readable mediums of claim 14, wherein the instructions are further to:
construct an eye based at least in part on the optimal test phase and the optimal test voltage;
select first and second phase and voltage pairs within the eye;
measure an error rate for each of the first and second phase and voltage pairs; and
compare the error rate of the first phase and voltage pair to the error rate of the second phase and voltage pair, and select an optimal phase and voltage pair.

16. The one or more computer-readable mediums of claim 13, wherein the instructions are further to receive a test pattern onto a first lane, and a crosstalk pattern on at least one adjacent lane.

17. The one or more computer-readable mediums of claim 16, wherein the crosstalk pattern is a logical inverse of the test pattern.

18. The one or more computer-readable mediums of claim 13, wherein the instructions are further to detect that an error rate has exceeded a threshold, and perform recentering.

19. A method of performing interconnect centering, comprising:
generating a clock signal at a low speed for the interconnect;
phase shifting the clock signal by a quantized first test phase;
detecting an error rate of the first test phase;
shifting the clock signal by a quantized second test phase;
measuring an error of the second test phase;
comparing the error rate of the first test phase to the error rate of the second test phase to select an optimal test phase;
selecting an operational phase of the clock signal based at least in part on the optimal test phase;
shifting a reference voltage of the clock signal by a first quantized test voltage;
measuring an error rate of the first test voltage at an operational speed for the interconnect;
shifting the reference voltage by a quantized second test voltage;
comparing the error rate of the first test voltage to an error rate of the second test voltage to select an optimal test voltage; and
selecting an operational voltage of the clock signal based at least in part on the optimal test voltage.

20. The method of claim 19, further comprising:
constructing an eye based at least in part on the optimal test phase and the optimal test voltage;
selecting first and second phase and voltage pairs within the eye;
measuring an error rate for each of the first and second phase and voltage pairs; and
comparing the error rate of the first phase and voltage pair to the error rate of the second phase and voltage pair, and select an optimal phase and voltage pair.

21. The method of claim 19, further comprising receiving a test pattern onto a first lane, and receiving a crosstalk pattern on at least one adjacent lane.

22. The method of claim 21, wherein the crosstalk pattern is a logical inverse of the test pattern.

23. The method of claim 19, further comprising detecting that an error rate has exceeded a threshold, and performing recentering.

* * * * *